US012681234B2

(12) United States Patent
Lin et al.

(10) Patent No.: US 12,681,234 B2
(45) Date of Patent: Jul. 14, 2026

(54) OPTOELECTRONIC PACKAGE

(71) Applicant: Advanced Semiconductor Engineering, Inc., Kaohsiung (TW)

(72) Inventors: Jr-Wei Lin, Kaohsiung (TW); Mei-Ju Lu, Kaohsiung (TW); Wen Chieh Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 465 days.

(21) Appl. No.: 18/105,704

(22) Filed: Feb. 3, 2023

(65) Prior Publication Data

US 2024/0264369 A1 Aug. 8, 2024

(51) Int. Cl.
G02B 6/12 (2006.01)
G02B 6/42 (2006.01)
G02B 6/43 (2006.01)
H10W 90/00 (2026.01)

(52) U.S. Cl.
CPC ......... *G02B 6/12004* (2013.01); *G02B 6/424* (2013.01); *G02B 6/4245* (2013.01); *G02B 6/43* (2013.01); *H10W 90/00* (2026.01); *H10W 90/722* (2026.01)

(58) Field of Classification Search
CPC ............................. G02B 6/12004; H01L 25/18
See application file for complete search history.

(56) References Cited

U.S. PATENT DOCUMENTS

| | | | |
|---|---|---|---|
| 6,821,802 B2 * | 11/2004 | Ahn | H01L 25/167 |
| | | | 257/E25.032 |
| 7,394,665 B2 * | 7/2008 | Hamasaki | H05K 7/1092 |
| | | | 361/767 |
| 8,831,437 B2 | 9/2014 | Dobbelaere et al. | |
| 9,036,952 B2 * | 5/2015 | La Porta | H05K 13/00 |
| | | | 385/2 |
| 9,507,086 B2 * | 11/2016 | Kobrinsky | G02B 6/30 |
| 9,651,751 B1 * | 5/2017 | Ding | G02B 6/4232 |
| 11,215,753 B2 | 1/2022 | Islam et al. | |
| 2011/0206379 A1 * | 8/2011 | Budd | H05K 1/141 |
| | | | 250/208.2 |
| 2022/0196918 A1 * | 6/2022 | Lin | G02B 6/4243 |
| 2022/0392881 A1 * | 12/2022 | Yu | H01L 25/16 |
| 2024/0192439 A1 * | 6/2024 | Janta-Polczynski | G02B 6/42 |

FOREIGN PATENT DOCUMENTS

| | | | | | |
|---|---|---|---|---|---|
| CN | 111103653 A | * | 5/2020 | | G02B 6/1225 |

* cited by examiner

*Primary Examiner* — Daniel Petkovsek
(74) *Attorney, Agent, or Firm* — Foley and Lardner LLP

(57) ABSTRACT

An optoelectronic package includes a first photonic component, an optical connection element and an optical component. The optical connection element is disposed at least partially over the first photonic component. The optical component is disposed at least partially over the first photonic component. The optical connection element and the optical component are spaced apart from each other.

20 Claims, 13 Drawing Sheets

OPTOELECTRONIC PACKAGE

BACKGROUND

1. Technical Field

The present disclosure relates generally to an optoelectronic package.

2. Description of the Related Art

Silicon photonics and optical engines with integration of at least an electronic IC (EIC) and a photonic IC (PIC) have advantages of high transmission speed and low power loss and thus are applied in various areas. Such integrated device requires transmission of optical signals between PICs.

SUMMARY

In some embodiments, an optoelectronic package includes a first photonic component, an optical connection element and an optical component. The optical connection element is disposed at least partially over the first photonic component. The optical component is disposed at least partially over the first photonic component. The optical connection element and the optical component are spaced apart from each other.

In some embodiments, an optoelectronic package includes a first optical engine, a second optical engine, and a first processing unit. The second optical engine is spaced from the first optical engine. The first processing unit is disposed under the first optical engine. The first optical engine is optically communicated with the second optical engine substantially horizontally and electrically communicated with the first processing unit substantially vertically.

In some embodiments, an optoelectronic package includes a first optical engine, a second optical engine, and a bridging component. The second optical engine is spaced from the first optical engine. The bridging component is configured to electrically connect the first optical engine and the second optical engine.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
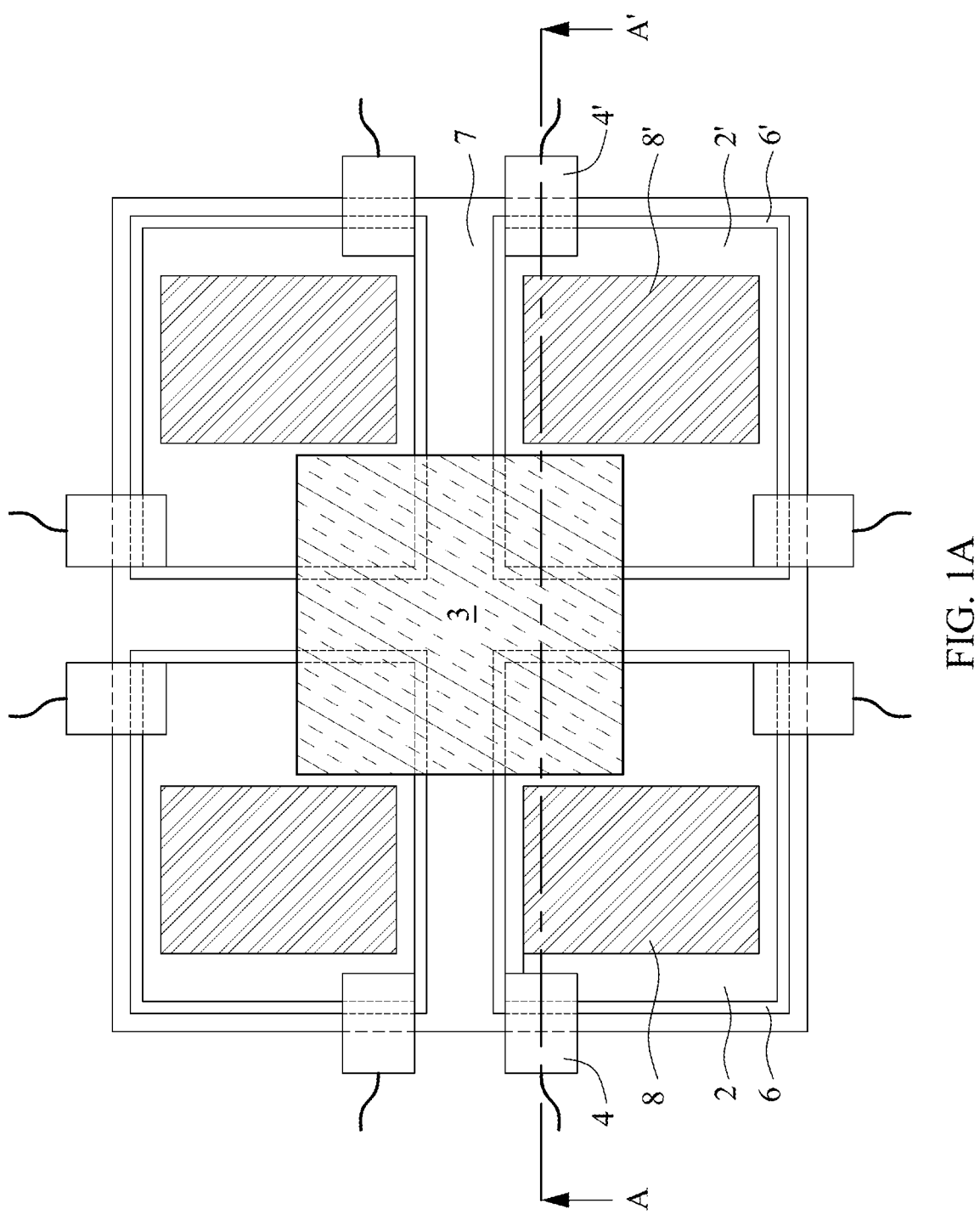
FIG. 1A illustrates a top view of an example of an optoelectronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature on or over a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein the term "active surface" may refer to a surface of an electronic component or passive element on which contact terminals such as contact pads are disposed. The term "active surface" may also refer to a surface of a photonic component along which a waveguide is disposed, and the waveguide may be disposed adjacent to the active surface.

Figure 1B:
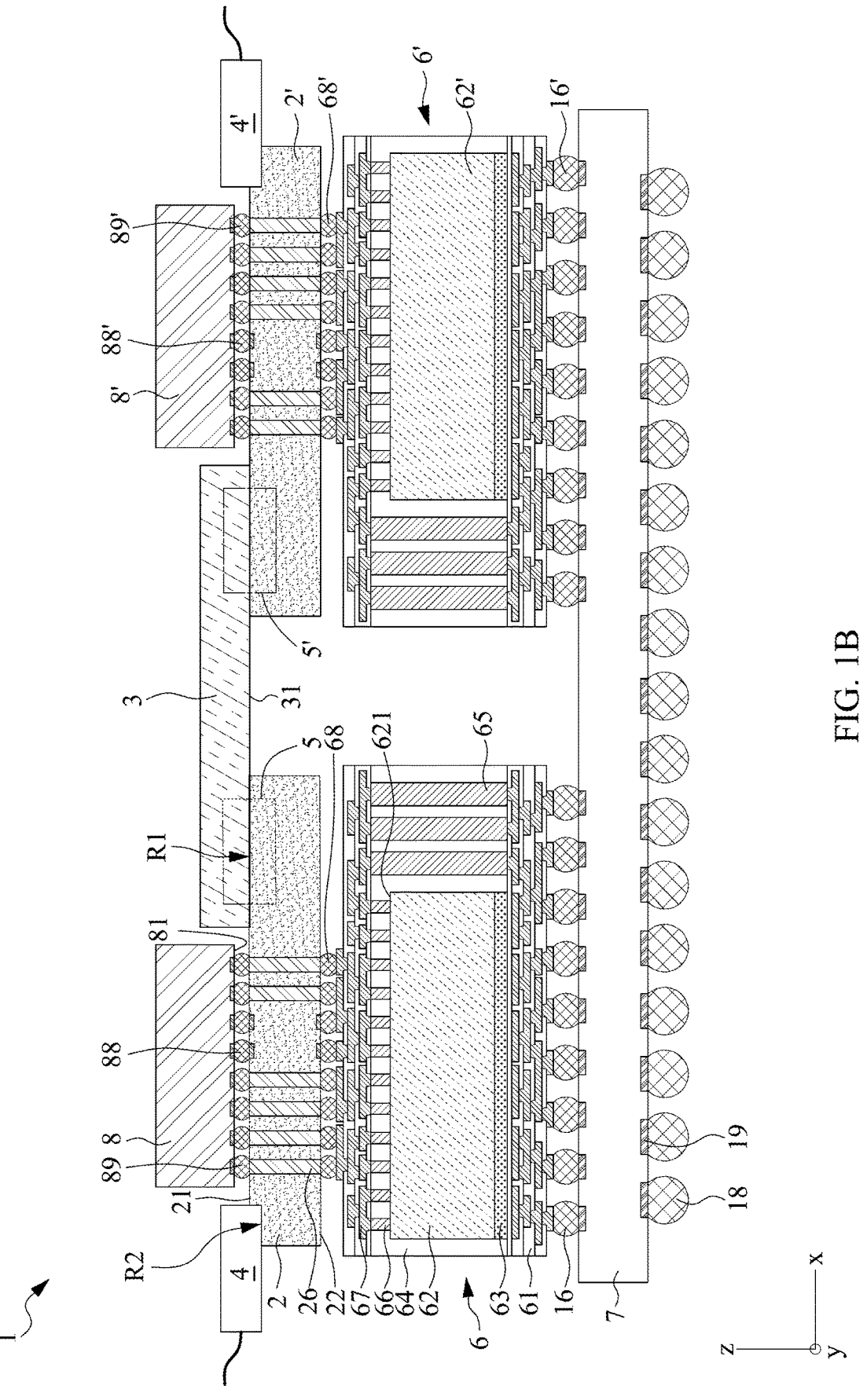
FIG. 1B illustrates a cross-sectional view along line A-A' of the optoelectronic package shown in FIG. 1A.

FIG. 1A illustrates a top view of an example of an optoelectronic package 1 according to some embodiments of the present disclosure. FIG. 1B illustrates a cross-sectional view along line A-A' of the optoelectronic package 1 as shown in FIG. 1. The optoelectronic package 1 may include a carrier 7, processing units 6 and 6', photonic components 2 and 2', an optical connection element 3, optical coupling structure 5 and 5', optical components 4 and 4', electronic components 8 and 8', electrical connection elements 88, 88', 68 and 68', and electrical contacts 16, 16' and 18.

The carrier 7 may include, for example, a printed circuit board, such as a paper-based copper foil laminate, a composite copper foil laminate, or a polymer-impregnated glass-fiber-based copper foil laminate. The carrier 7 may include an interconnection structure, which may include such as a plurality of conductive traces and/or a plurality of conductive vias. The interconnection structure may include a redistribution layer (RDL) and/or a grounding element. In some embodiments, the carrier 7 includes a ceramic material or a metal plate. In some embodiments, the carrier 7 may include a substrate, such as an organic substrate or a leadframe. In some embodiments, the carrier 7 may include a two-layer substrate which includes a core layer and a conductive material and/or structure disposed on an upper surface and a bottom surface of the carrier 7. The conductive material and/or structure may include a plurality of traces. The carrier 7 may include one or more conductive pads 19 in proximity to, adjacent to, or embedded in and exposed at an upper surface and/or a bottom surface of the carrier 7. The carrier 7 may include a solder resist (not shown) on the upper surface and/or the bottom surface of the carrier 7 to fully expose or to expose at least a portion of the conductive pads 19 for electrical connections. The electrical contact(s) 18 may be disposed on the conductive pads 19 for external connection purpose. The electrical contact(s) 18 may be or include a ball grid array (BGA), or a land grid array (LGA). The electrical contact(s) 18 may include one or more conductive materials such as a metal or metal alloy. Examples include gold (Au), silver (Ag), aluminum (Al), copper (Cu), or an alloy thereof. In some embodiments, the carrier 7 supports the processing units 6 and 6', the photonic components 2 and 2' and the electronic components 8 and 8'.

The processing unit 6 may be disposed over the carrier 7 and electrically connected to the carrier 7. In some embodiments, the processing unit 6 may be disposed adjacent to the carrier 7. In some embodiments, the processing unit 6 is electrically connected to the carrier through a conductive via 65 penetrating through the processing unit 6. In some embodiments, the processing unit 6 may include circuit structures 61 and 67, a processing die 62, an adhesive film 63, a dielectric structure 64, a conductive via 65 and a conductive structure 66. In some embodiments, the processing die 62 has an active surface 621 facing away from the carrier 7 and a back surface opposite to the active surface. The dielectric structure 64 surrounds or encapsulates the processing die 62. The circuit structures 61 and 67 are disposed on two opposite sides of the dielectric structure 64. In some embodiments, the circuit structure 61 is located between the carrier 7 and the processing unit 6 and electrically connected to the carrier 7, for example, through the electrical contact(s) 16. In some embodiments, the circuit structures 61 and 67 may be or include a RDL structure which may include a plurality dielectric layers and conductive layers stacked alternatively. The adhesive film 62 may be disclosed on the back surface of the processing die 62 and has a surface coplanar to a surface of the dielectric structure 64. The processing die 62 may be an ASIC, an FPGA, a GPU, or the like, or a combination thereof. The conductive via 65 may be disposed adjacent to or surround the processing die 62. The conductive via 65 penetrates through the dielectric structure 64 and electrically connects the circuit structures 61 and 67. The conductive structure 66 may be disposed on the active surface of the processing die 62, exposed from the dielectric structure 64 and electrically connect the processing die 62 to the circuit structure 67.

Figure 6:
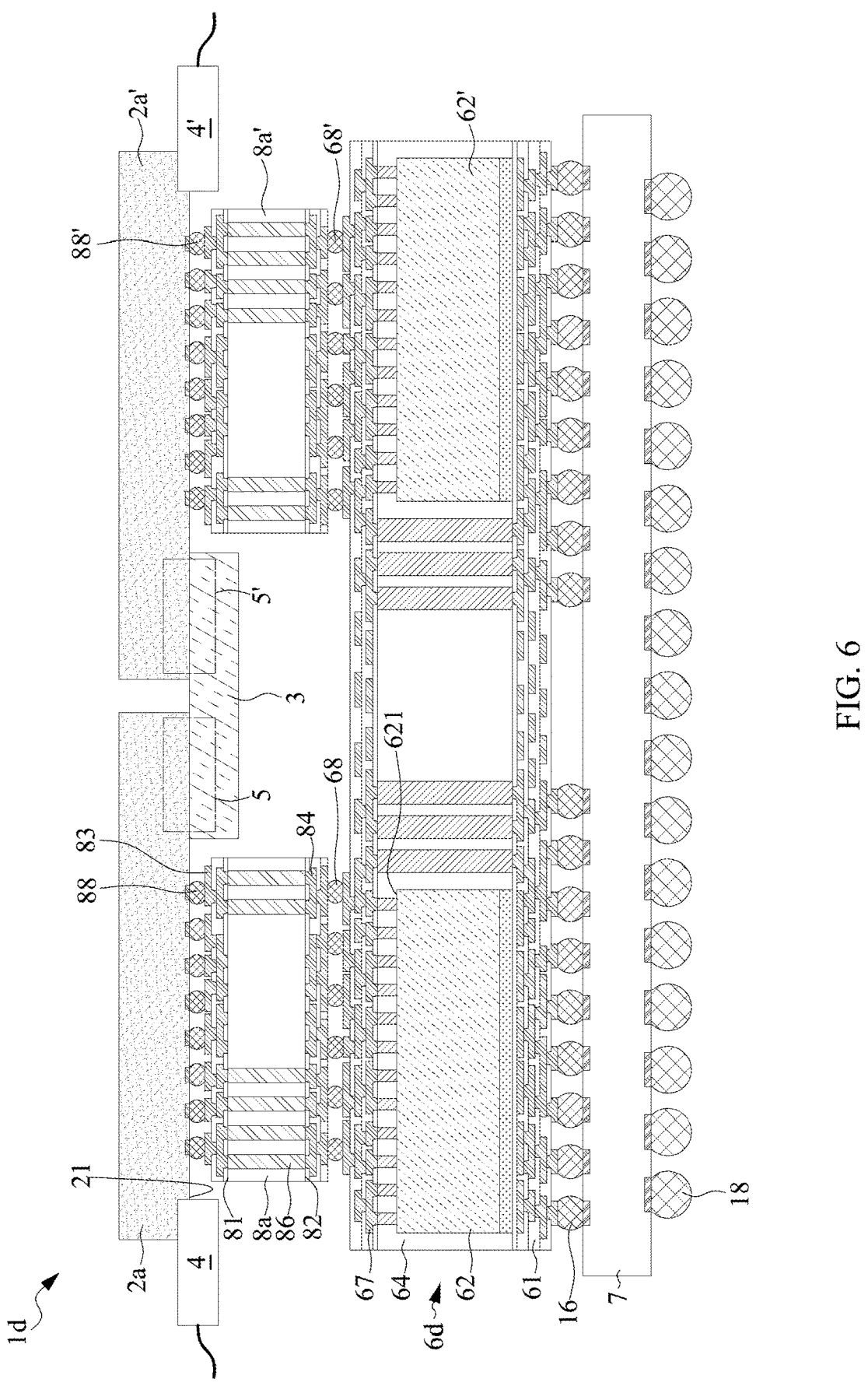
FIG. 6 illustrates a cross-sectional view of an example of an optoelectronic package according to some embodiments of the present disclosure.

In some embodiments, the processing unit 6' may have the same or similar components and/or arrangements as the processing unit 6. The processing unit 6' may also be disposed over the carrier 7 and electrically connected to the carrier 7. In some embodiments, the processing unit 6' may be disposed adjacent to the carrier 7. The processing units 6 and 6' may electrically communicate with each other through the carrier 7. In some embodiments, the processing unit 6' may be a part of the processing unit 6 or the processing unit 6' and the processing unit 6 are formed or integrated in a single processing unit (as shown in FIG. 6).

The electrical contact(s) 16 may electrically connect the processing unit 6 to the carrier 7. The electrical contact(s) 16' may electrically connect the processing unit 6' to the carrier 7. The electrical contacts 16 and 16' may be or include C4 bumps, a BGA, or an LGA. The electrical contacts 16 and 16' may include one or more conductive materials such as a metal or metal alloy. Examples include Au, Ag, Al, Cu, or an alloy thereof.

The photonic components 2 and 2' may be configured to process, receive, and/or transmit optical signal(s), such as converting optical signal(s) to electric signal(s), or converting electric signal(s) to optical signal(s). For example, the photonic component 2 is configured to convert electric signals (e.g., received from the electronic component 8) to optical signals (e.g., for transmission to the optical connection element 3 and/or the optical component 4), or convert optical signals (e.g., received from the optical connection element 3 and/or the optical component 4) to electric signals (e.g., for transmission to the electronic component 8). In some embodiments, the photonic component 2 is configured to convert optical signals received from the optical connection element 3 to electric signals (e.g., for transmission to the electronic component 8), or convert electric signals (e.g., received from the electronic component 8) to optical signals for transmission to the optical connection element 3. In some embodiments, the photonic component 2 may be or include a photonic IC (PIC).

The photonic component 2 may have a surface 21 and a surface 22 opposite to the surface 21. The surface 21 of the photonic component 2 may be an active surface. The surface 21 of the photonic component 2 may face the electronic component 8 and may be electrically connected to the electronic component 8. In some embodiments, the photonic component 2 includes one or more conductive vias 26 (may be referred to as "tall pillars") penetrating through the first photonic component 2. The conductive via 26 may be configured to transmit electrical signals from the surface 21 to the surface 22 and/or from the surface 22 to the surface 21. The photonic component 2 may be disposed on or over the processing unit 6. The processing unit 6 may be disposed under the photonic component 2. In some embodiments, the surface 22 of the photonic component 2 faces the processing unit 6. The surface 21 (the active surface) of the photonic component 2 faces away from the processing unit 6. The conductive via 26 of the photonic component 2 may be electrically connected to the processing unit 6.

The photonic component 2' is separated or spaced apart from the photonic component 2. In some embodiments, the photonic component 2' may have the same or similar components and/or arrangements as the photonic component 2.

The electrical connection element(s) 68 may electrically connect the conductive via 26 of the photonic component 2 to the processing unit 6 (or the circuit structure 67). The electrical connection element(s) 68' may electrically connect the conductive via of the photonic component 2' to the processing unit 6' (or the circuit structure of the processing unit 6'; not denoted). The electrical connection elements 68 and 68' may be or include conductive bumps, solder balls, or the like. The electrical connection elements 68 and 68' may include one or more conductive materials such as a metal or metal alloy. Examples include Au, Ag, Al, Cu, or an alloy thereof.

The optical connection element 3 (also called "optical connection member") may be disposed at least partially over the photonic component 2 and/or at least partially over the photonic component 2'. In some embodiments, the optical connection element 3 covers a corner of the photonic component 2 and/or a corner of the photonic component 2'. A projection of the optical connection element 3 in a vertical direction (z-direction in FIG. 1B) covers only a portion of the photonic component 2 and only a portion of the photonic component 2'. A portion of the photonic component 2 and/or a portion of the photonic component 2' is uncovered by the optical connection element 3 (or the projection of the optical connection element 3 in a vertical direction). The optical connection element 3 is configured for internal optical signal communication (i.e., optical signal communication within the optoelectronic package 1, such as between two or more photonic components). In some embodiments, the optical connection element 3 is configured to provide a short-distance transmission of optical signals for the photonic component 2 and/or the photonic component 2'. For example, optical connection element 3 is configured to provide optical signal transmission between the photonic component 2 and the photonic component 2'. The optical connection element 3 optically connects (or optically couples) the photonic components 2 and 2'.

In some embodiments, the optical connection element 3 may be a bridge element configured for signal communication. For example, in some embodiments, the optical connection element 3 may be configured as an optical bridge element to optically couple two or more photonic components. The optical connection element 3 may be or include a compact integrated waveguide ensemble (CIWE). In some embodiments, the optical connection element 3 may further include a circuit structure and be configured as an electrical bridge element to transmit electric signals. In some embodiments, the optical connection element 3 may include active components or passive components as needed while in some embodiments, the optical connection element 3 may be only configured for signal communication and includes no additional active/passive components.

The optical coupling structure 5 may be formed or disposed between the photonic component 2 and the optical connection element 3. The optical connection element 3 may be optically coupled to the photonic component 2 through the optical coupling structure 5. The optical coupling structure 5' may be formed or disposed between the photonic component 2' and the optical connection element 3. The optical connection element 3 may be optically coupled to the photonic component 2' through the optical coupling structure 5'.

The optical component 4 may be disposed at least partially over the photonic component 2. In some embodiments, the optical component 4 is connected to the photonic component 2. The optical component 4 may be connected to the photonic component 2 through a waveguide (not shown in FIG. 1B). The optical component 4 is configured for external optical signal communication. In some embodiments, the optical component 4 is configured to provide a long-distance transmission of optical signals for the first photonic component 2. For example, the optical component 4 may be configured to provide optical signal transmission between the photonic component 2 and a component outside of the optoelectronic package 1. Similarly, the optical component 4' is disposed at least partially over the photonic component 2'. Specifically, the optical component 4' may have the similar component and/or arrangements as the optical component 4. In some embodiments, the optical components 4 and 4' independently includes an optical fiber array component. In some embodiments, the optical fiber array component includes an integrated component including a plurality of fiber array units (FAUs). In some embodiments, as shown in FIG. 1A, the optoelectronic package 1 may include two or more optical components 4 disposed on the photonic component 2, and/or two or more optical components 4' disposed on the photonic component 2'.

Figure 1D:
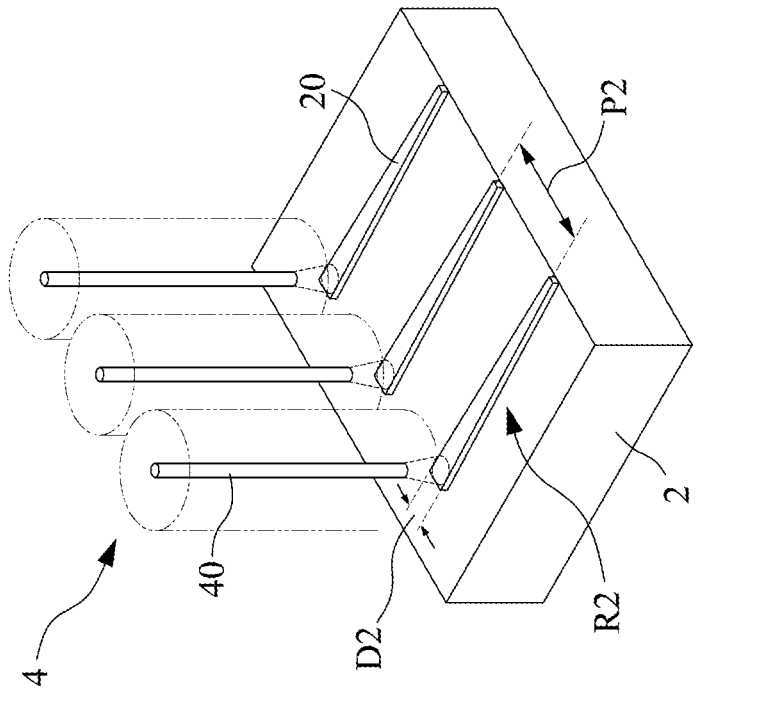
FIG. 1D illustrates a perspective view of a portion of an optoelectronic package according to some embodiments of the present disclosure.

In some embodiments, the photonic component 2 is optically coupled with the optical connection element 3 and the optical component 4. The optical connection element 3 and the optical component 4 are separated or spaced apart from each other. In some embodiments, the photonic component 2 includes a region R1 and a region R2. The optical connection element 3 is optically coupled to the region R1 of the photonic component 2. The optical component 4 is optically coupled to the region R2 of the photonic component 2. The region R1 is configured to provide an optical coupling type different from that of the region R2. For example, the region R2 may be configured to provide a grating coupling or an edge coupling, and the region R1 may be configured to provide an optical coupling type different from a grating coupling and an edge coupling. For example, the region R1 may be configured to provide an optical coupling as illustrated in FIGS. 1C, and 2A to 2E, which will be discussed in details hereinafter. For example, the region R2 may be configured to provide an optical coupling as illustrated in FIGS. 1D to 1E, which will be discussed in details hereinafter.

The electronic component 8 may be disposed at least partially over the photonic component 2. In some embodiments, the electronic component 8 may be disposed at least partially between the optical connection element 3 and the optical component 4 in a cross-sectional view. In some embodiments, the electrical component 8 may be electrically connected with the photonic component 2. In some embodiments, the electronic component 8 may be electrically connected to the processing unit 6, such as through the conductive via 26 of the photonic component 2. In some embodiments, the electronic component 8 may be electrically connected to the carrier 7, such as through the conductive via 65 of the processing unit 6. In some embodiments, the electronic component 8 and the processing unit 6 are disposed on two opposite surfaces of the photonic component 2. The photonic component 2 is located between the processing unit 6 and the electronic component 8. As shown in FIG. 1B, the electronic component 8 is disposed on the surface 21 of the photonic component 2. The processing unit 6 is disposed on the surface 22 of the photonic component 2. The electronic component 8 has a surface 81 facing the active surface 621 of the processing unit 6. The surface 81 of the electronic component 8 may be an active surface.

As shown in FIG. 1B, the electronic component 8' may be disposed at least partially over the photonic component 2'. The electronic component 8' may have the similar component and/or arrangements as the electronic component 8. The optical connection element 3 may be disposed between the electronic component 8 and the electronic component 8'. In some embodiments, the optical connection element 3 is separated, spaced apart or distinct from the electronic components 8 and 8'. The electronic component 8' electronic components 8 and 8' may be communicated with each other through the optical connection element 3, for example, through a circuit structure within the optical connection element 3 or further through a circuit structure within the photonic component 2. In some embodiments, the electronic components 8 and 8' may independently include an integrated digital signal processor (DSP), a transimpedance amplifier (TIA), a driver (DRV), or a combination thereof.

The electrical connection element(s) 88 may electrically connect the electronic component 8 to the photonic component 2. The electrical connection element(s) 89 may electrically connect the electronic component 8 to the circuit structure 67 of the processing unit 6 through the conductive via 26 of the photonic component 2. The electrical connection elements 88 and 89 may be or include conductive bumps, solder balls, or the like. The electrical connection elements 88 and 89 may include one or more conductive materials such as a metal or metal alloy. Examples include Au, Ag, Al, Cu, or an alloy thereof. The electrical connection elements 88' and 89' may have the similar components and/or arrangements as the electrical connection elements 88 and 89.

In some embodiments, the photonic component 2 receives electric signals from the electrical component 8, converts the electric signals to optical signals, and transmits the electric signals to the photonic component 2' through the optical connection element 3. In some embodiments, the photonic component 2 receives the electric signals from the electrical component 8, converts the electric signals to the optical signals, and further transmits the optical signals through the optical component 4 to a device outside of the optoelectronic package.

A photonic component and an electronic component may be jointly called "optical engine", or integrated as an optical engine. In some embodiments, the photonic component 2 and the electronic component 8 are jointly called "optical engine", or are integrated as an optical engine (e.g., a first optical engine). The photonic component 2' and the electronic component 8' are jointly called "optical engine", or are integrated as an optical engine (e.g., a second optical engine). In other words, the first optical engine includes the photonic component 2 and the electronic component 8. The second optical engine includes the photonic component 2' and the electronic component 8'. The second optical engine is spaced from the first optical engine.

The optical connection element 3 may be disposed at least partially on or over the first optical engine and/or the second optical engine. In some embodiments, a projection of the optical connection element 3 in a vertical direction covers a portion of the first optical engine and only a portion of the second optical engine. For example, the projection of the optical connection element 3 in a vertical direction covers only a portion of the photonic component 2 of the first optical engine, and only a portion of the photonic component 2' of the second optical engine; the remaining portions of the photonic component 2 of the first optical engine and the photonic component 2' of the second optical engine are not covered by such projection. The optical connection element 3 may be configured to be optically coupled with the first optical engine and the second optical engine. In some embodiments, the optical connection element 3 is configured to optically connect the first optical engine and the second optical engine. In some embodiments, the first optical engine is optically communicated with the second optical engine through the optical connection element 3. The first optical engine may be optically communicated with the second optical engine substantially horizontally (such as substantially in a horizontal direction), e.g., through the optical connection element 3.

In some embodiments, the processing unit 6 is disposed under the first optical engine. The processing die 62 is disposed at least partially under the first optical engine. The active surface 621 of the processing unit 6 faces the first optical engine. The processing unit 6 may be electrically connected to the first optical engine. In some embodiments, the first processing unit 6 is electrically connected to the first optical engine (e.g., the electronic component 8 of the first optical engine) through a tall pillar within the first optical engine (e.g., the conductive via 26 penetrating through the photonic component 2). The first optical engine may be electrically communicated with the first processing unit substantially vertically (such as substantially in a vertical direction). In some embodiments, the processing unit 6' is disposed under and electrically connected to the second optical engine. The processing die 62' is disposed at least partially under the second optical engine.

Figure 1C:
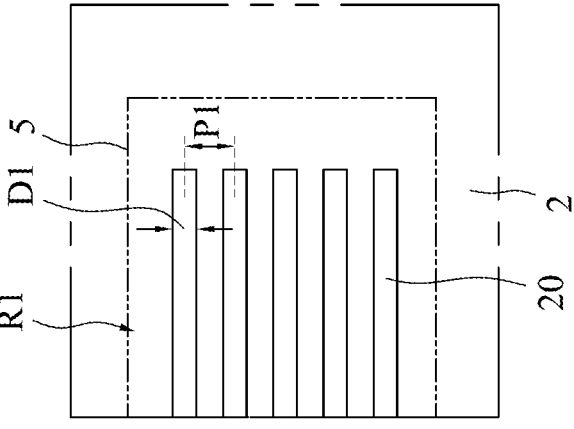
FIG. 1C illustrates a top view of a portion of the region R1 of an optoelectronic package according to some embodiments of the present disclosure.
Figure 1E:
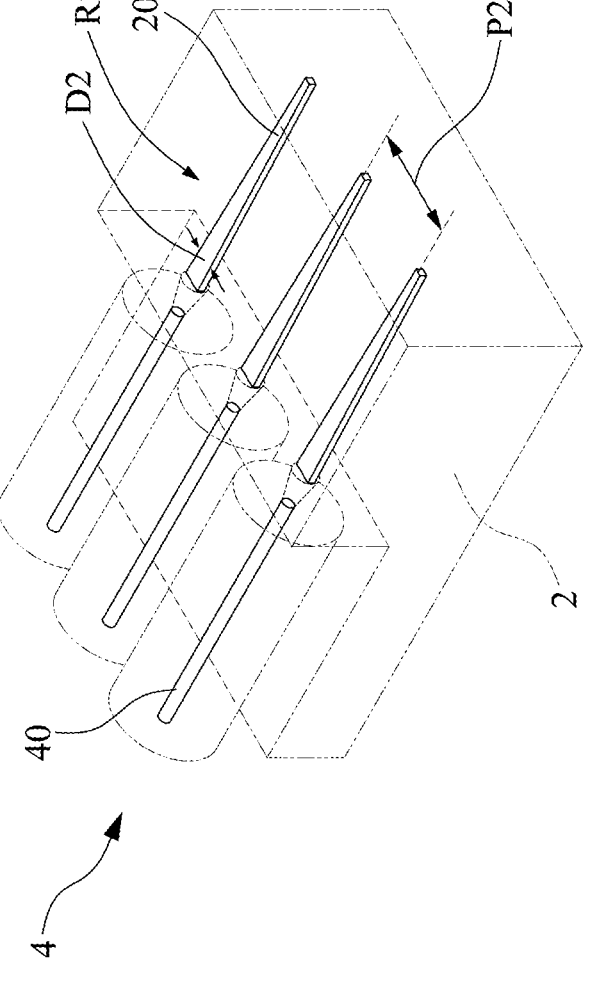
FIG. 1E illustrates a perspective view of a portion of an optoelectronic package according to some embodiments of the present disclosure.

FIG. 1C illustrates a top view of a portion of an optoelectronic package according to some embodiments of the present disclosure. FIG. 1D illustrates a prospective view of a portion of an optoelectronic package according to some embodiments of the present disclosure, and FIG. 1E illustrates a prospective view of a portion of an optoelectronic package according to some embodiments of the present disclosure. In some embodiments, FIG. 1C illustrates a top view of a portion of the region R1 of the optoelectronic package 1. FIG. 1D illustrates a prospective view of a portion of the region R2 of the optoelectronic package. FIG. 1E illustrates a prospective view of a portion of the region R2 of the optoelectronic package.

As shown in FIG. 1C, in some embodiments, input-output (I/O) terminals (e.g., waveguides 20) at the region R1 of the photonic component 2 has a diameter D1 (e.g., a width). In some embodiments, the I/O terminals (or the waveguides 20) at the region R1 has a pitch P1. In some embodiments, the I/O terminals (or the waveguides 20) at the region R1 are configured to optically coupled to waveguides 30 of the optical connection element 3 (as show in FIGS. 2A to 2E) through optical coupling structure 5. In some embodiments, the region R1 is configured to provide an optical coupling as illustrated in FIGS. 2A to 2E, which will be discussed in details hereinafter.

As shown in FIG. 1D, in some embodiments, I/O terminals (e.g., waveguides 20) at the region R2 of the photonic component 2 has a diameter D2 (e.g., a width). In some embodiments, the I/O terminals (or the waveguides 20) at the region R2 has a pitch P2. In some embodiments, the region R2 is configured to provide a grating coupling. In some embodiments, the I/O terminals (or the waveguides 20) at the region R2 are optically coupled to the fibers 40 of the optical component 4 through grating coupling.

As shown in FIG. 1E, in some other embodiments, I/O terminals (e.g., the waveguides 20) at the region R2 of the photonic component 2 has a diameter D2 (e.g., a width). In some embodiments, the I/O terminals (or the waveguides 20) at the region R2 has a pitch P2. In some embodiments, the region R2 is configured to provide an edge coupling. In some embodiments, the I/O terminals (or the waveguides 20) at the region R2 are optically coupled to the fibers 40 of the optical component 4 through edge coupling.

In some embodiments, a density of the I/O terminals at the region R1 is greater than a density of the I/O terminals at the region R2. In some embodiments, the pitch P1 of the I/O terminals at the region R1 is less than the pitch P2 of the I/O terminals at the region R2. In some embodiments, the diameter D1 of one or the I/O terminals at the region R1 is less than the diameter D2 of one of the I/O terminals at the region R2.

In the optoelectronic package according to some embodiments of the existing techniques, optical signals are transmitted between optical engines by passing through the fibers or polymeric waveguides formed on/within a substrate supporting the optical engines. However, the dimension (e.g., diameter or width) of the fibers or polymeric waveguides is larger than that of the waveguides of the optical engine, and therefore, connections between transmitters (TX) and receivers (RX) of the optical engines may occupy relatively large areas. As such, the package areas and volumes are undesirably increased. In addition, since the waveguides are pre-formed on the substrate, the flexibility of packaging is relatively low.

In contrast, according to some embodiments of the present disclosure, the optical connection element 3 may serve as an optical bridge element that optically couples the optical engines (e.g., the photonic components 2 and 2' of the first and second optical engines). The dimension of the waveguides (or light transmission channel) of the optical connection element 3 is more close to that of the optical engines as compared to the fibers or polymeric waveguides, and therefore, the connections between the optical connection element 3 and the optical engines may occupy relatively small areas. In addition, the arrangement of the optical connection element 3 may vary according to the arrangements of the optical engines (e.g., the photonic components 2 and 2' of the first and second optical engines), and therefore the flexibility of packaging is significantly increased.

In the optoelectronic package according to some embodiments of the existing techniques where optical component(s) and photonic component(s) are spaced apart from each other and disposed on a photonic interposer for optical signal transmission, since the optical component(s) are configured for external optical signal communication, the optical component(s) are preferably located adjacent to a periphery of the optoelectronic package. Accordingly, the photonic interposer must extend to the periphery of the optoelectronic package to support and optical couple with the optical component, thus the size of the photonic interposer would be large. In addition, the photonic interposer must include I/O terminals with at least two different optical coupling types for optical coupling with the photonic component(s) and the optical component(s). This results in a complicated manufacturing process of the optical connection element, with low production yield and high manufacturing cost.

In contrast, according to some embodiments of the present disclosure, the optical connection element 3 and the optical component 4 are disposed on the photonic component 2. Accordingly, the optical connection element 3 may have a small size, and only one optical coupling type is required for the I/O terminals of the optical connection element 3. The manufacturing cost of the optical connection element 3 may be reduced, and the production yield may be improved.

Furthermore, according to some embodiments of the present disclosure, since the photonic component 2 and the electronic component 8 are disposed on or over the processing unit 6, the photonic component 2, the electronic component 8 and the processing unit 6 may occupy a relatively small area of the carrier 7. In addition, electric signals between the electronic component 8 and the processing unit 6 through a relatively short electrically-conductive path, without passing through the carrier 7.

Figure 2A:
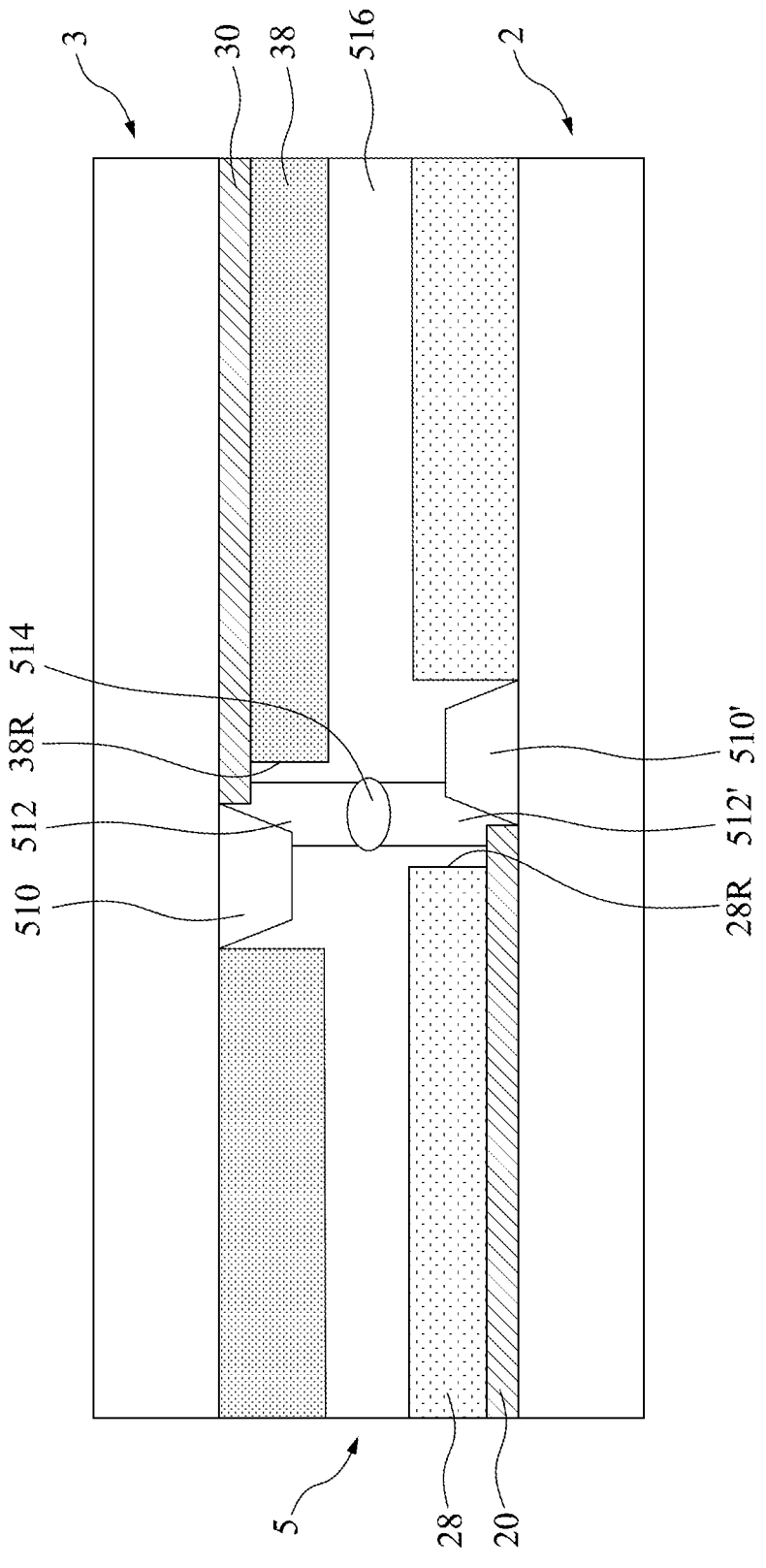
FIG. 2A illustrates a cross-sectional view of a portion of an optoelectronic package according to some embodiments of the present disclosure.

FIG. 2A illustrates a cross-sectional view of a portion of an optoelectronic package according to some embodiments of the present disclosure. For example, FIG. 2A may illustrate a portion of the optoelectronic package 1 including the optical coupling structure 5 that optically couples the optical connection element 3 to the photonic component 2. In some embodiments, FIG. 2A may illustrate a cross-sectional view of a portion of the optoelectronic package 1 including the optical coupling structure 5' that optically couples the optical connection element 3 to the photonic component 2'.

In some embodiments, the photonic component 2 includes a waveguide 20 and a dielectric layer 28. In some embodiments, the waveguide 20 is partially embedded in the dielectric layer 28. In some embodiments, the dielectric layer 28 includes or defines a recess 28R, and a portion of the waveguide 20 is exposed by the recess 28R. In some embodiments, a refractive index of the waveguide 20 is equal to or greater than about 2.0, about 2.2, about 3, or about 3.5. The waveguide 20 may be or include silicon, silicon nitride ($Si_3N_4$), lithium niobate ($LiNbO_3$), or a combination thereof. In some embodiments, the waveguide 20 and the dielectric layer 28 may be formed by film deposition and lithography patterning processes. In some embodiments, a refractive index of the dielectric layer 28 is equal to or less than less than about 2.7, about 2.4, about 2, or about 1.5. The dielectric layer 28 may include silicon oxide. In some embodiments, the refractive index of the waveguide 20 is greater than the refractive index of the dielectric layer 28.

In some embodiments, the optical connection element 3 includes a waveguide 30 and a dielectric layer 38. In some embodiments, the waveguide 30 is partially embedded in the dielectric layer 38. In some embodiments, the dielectric layer 38 includes or defines a recess 38R, and a portion of the waveguide 30 is exposed by the recess 38R. In some embodiments, a refractive index of the waveguide 30 is equal to or greater than about 2.0, about 2.2, about 3, or about 3.5. The waveguide 30 may be or include silicon, silicon nitride ($Si_3N_4$), lithium niobate ($LiNbO_3$), or a combination thereof. In some embodiments, the waveguide 30 and the dielectric layer 38 may be formed by film deposition and lithography patterning processes. In some embodiments, a refractive index of the dielectric layer 38 is equal to or less than less than about 2.7, about 2.4, about 2, or about 1.5. The dielectric layer 38 may include silicon oxide. In some embodiments, the refractive index of the waveguide 30 is greater than the refractive index of the dielectric layer 38.

In some embodiments, the optical coupling structure 5 is between the photonic component 2 and the optical connection element 3. In some embodiments, the optical coupling structure 5 is configured to optically couple the waveguide 20 to the waveguide 30. In some embodiments, the optical coupling structure 5 includes an optical coupling element partially overlapping the waveguide 20 and the waveguide 30 vertically or from a top view perspective. The optical coupling structure 5 may include one or more light refractive elements, one or more light propagation elements, one or more bonding elements, one or more optically-transmissive elements, or a combination thereof.

In some embodiments, the optical coupling structure 5 includes light refractive elements 510 and 510', light propagation elements 512 and 512', a bonding element 514, and an optically-transmissive element 516.

In some embodiments, the light refractive element 510 is disposed in the recess 38R, and the light refractive element 510 is disposed in the recess 28R. In some embodiments, the light refractive elements 510 and 510' are between the optical connection element 3 and the photonic component 2 and configured to direct a light to the waveguide 20 of the photonic component 2 and/or to the waveguide 30 of the optical connection element 3. In some embodiments, the light refractive elements 510 and 510' are configured to direct a light from the waveguide 30 of the optical connection element 3 to the waveguide 20 of the photonic component 2. In some embodiments, the light refractive elements 510 and 510' are configured to direct a light from the waveguide 20 of the photonic component 2 to the waveguide 30 of the optical connection element 3. In some embodiments, the light refractive elements 510 and 510' may be or include optically-transmissive elements that are between and optically coupled to the optical connection element 3 and the photonic component 2. In some embodiments, the light refractive elements 510 and 510' each includes a photoresist structure. In some embodiments, the light refractive elements 510 and 510' each includes a negative-tone photoresist. In some embodiments, a refractive index of the light refractive element 510 is less than about 3, about 2.7, about 2.4, or about 2. In some embodiments, a refractive index of the light refractive element 510' is less than about 3, about 2.7, about 2.4, or about 2. The refractive indexes of the light refractive elements 510 and 510' may be the same or different depending on the actual applications.

In some embodiments, the light propagation element 512 contacts the waveguide 30, and the light propagation element 512' contact the waveguide 20. In some embodiments, the light propagation element 512 and 512' are between the optical connection element 3 and the photonic component 2 and configured to direct a light to the light refractive elements 510 and 510'. In some embodiments, the light refractive element 510 is configured to direct a transmission of light between the light propagation element 512 and the waveguide 30. In some embodiments, the light refractive element 510' is configured to direct a transmission of light between the light propagation element 512' and the waveguide 20. In some embodiments, the light propagation element 512 and 512' define a light propagation direction substantially perpendicular to at least one of an extending direction of the waveguide 20 and an extending direction of the waveguide 30. In some embodiments, the light propagation element 512 and 512' may be or include optically-transmissive elements that are between and optically coupled to the optical connection element 3 and the photonic component 2. In some embodiments, the light propagation element 512 and 512' each includes a photoresist structure. In some embodiments, the light propagation element 512 and 512' each is doped with high-refractive index particles, such as $TiO_2$ particles. In some embodiments, a refractive index of the light propagation element 512 is greater than about 1.5, about 2, about 2.4, or about 2.7. In some embodiments, a refractive index of the light refractive element 510' is greater than about 1.5, about 2, about 2.4, or about 2.7. The refractive indexes of the light propagation elements 512 and 512' may be the same or different depending on the actual applications. In some embodiments, the refractive indexes of the light refractive elements 510 and 510' are less than the refractive indexes of the light propagation element 512 and 512'.

In some embodiments, the bonding element 514 contacts the light propagation element 512 and the light propagation element 512'. In some embodiments, the bonding element 514 connects or bonds the light propagation element 512 to the light propagation element 512'. In some embodiments, the bonding element 514 is between the optical connection element 3 and the photonic component 2 and configured to direct a light between the light propagation element 512 and 512'. In some embodiments, the bonding element 514 defines a light propagation direction substantially perpendicular to an extending direction of the waveguide 20, an extending direction of the waveguide 30, or both. In some embodiments, the bonding element 514 may be or include an optically-transmissive element that is between and optically coupled to the optical connection element 3 and the photonic component 2. In some embodiments, the bonding element 514 includes an adhesive layer. In some embodiments, the bonding element 514 includes a polymer structure, such as a thermal-cured polymer or a UV-cured polymer (e.g., an epoxy polymer). In some embodiments, a refractive index of the bonding element 514 is greater than about 1.5, about 2, about 2.4, or about 2.7. The refractive indexes of the light propagation elements 512 and 512' and the refractive index of the bonding element 514 may be the same or different depending on the actual applications. In some embodiments, the refractive indexes of the light refractive elements 510 and 510' are less than the refractive index of the bonding element 514.

In some embodiments, the optically-transmissive element 516 is disposed between the photonic component 2 and the optical connection element 3. In some embodiments, the optically-transmissive element 516 covers the light propagation elements 512 and 512'. In some embodiments, the optically-transmissive element 516 further covers the light refractive elements 510 and 510' and the bonding element 514. In some embodiments, the optically-transmissive element 516 is filled between the dielectric layer 28 and the dielectric layer 38. In some embodiments, a refractive index of the optically-transmissive element 516 is less than about 3, about 2.7, about 2.4, about 2, about 1.8, or about 1.5. In some embodiments, the refractive index of the optically-transmissive element 516 is less than the refractive indexes of the light propagation elements 512 and 512'. In some embodiments, the optically-transmissive element 516 includes air, an inorganic dielectric layer, a polymer layer, or a combination thereof.

The light refractive element 510 may be configured to alter or adjust a light propagation path of a light from the waveguide 20. In some embodiments, the light transmitted in the waveguide 20 may reach and be reflected by the light refractive element 510 so as to change its propagation path (or its propagation direction) toward the light propagation element 512. Then, the light may be transmitted through the light propagation element 512, the bonding element 514, and the light propagation element 512' in turns and reach the light refractive element 510'. The light refractive element 510' may be configured to alter or adjust a light propagation path of a light from the light propagation elements 512 and 512'. In some embodiments, the light transmitted in the light propagation elements 512 and 512' may reach and be reflected by the light refractive element 510' so as to change its propagation path (or its propagation direction) toward the waveguide 30. According to the design of the light refractive elements 510 and 510' and the light propagation elements 512 and 512', a light may be optically coupled between the waveguide 20 of the photonic component 2 and the waveguide 30 of the optical connection element 3 by altering or adjusting the propagation path (or the propagation direction) of the light.

Figure 2B:
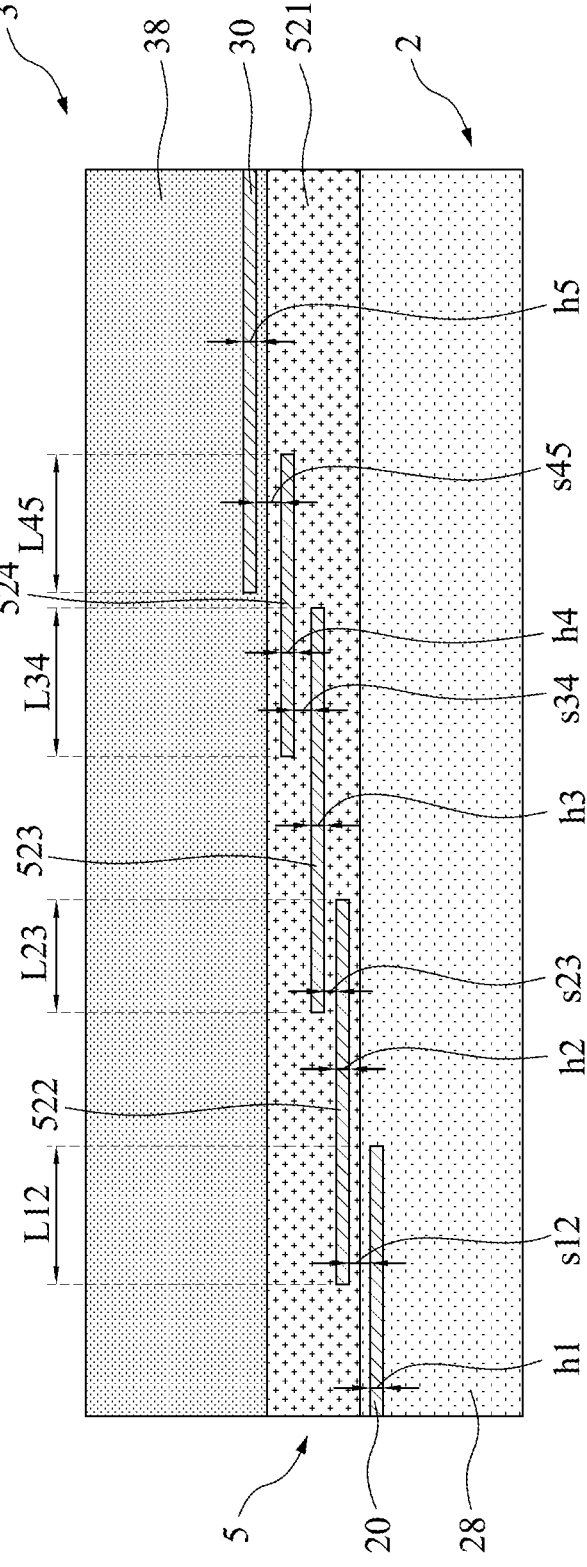
FIG. 2B illustrates a cross-sectional view of a portion of an optoelectronic package according to some embodiments of the present disclosure.

FIG. 2B illustrates a cross-sectional view of a portion of an optoelectronic package according to some embodiments of the present disclosure. For example, FIG. 2B may illustrate a portion of the optoelectronic package 1 including the optical coupling structure 5 that optically couples the optical connection element 3 to the photonic component 2. In some embodiments, FIG. 2B may illustrate a cross-sectional view of a portion of the optoelectronic package 1 including the optical coupling structure 5' that optically couples the optical connection element 3 to the photonic component 2'.

In some embodiments, the waveguide 20 is embedded in the dielectric layer 28. In some embodiments, the waveguide 30 is embedded in the dielectric layer 38.

In some embodiments, the optical coupling structure 5 includes an optically-transmissive element 521 and a plurality of waveguide elements (e.g., waveguide elements 522, 523, and 524) between the photonic component 2 and the optical connection element 3. In some embodiments, the optically-transmissive element 521 connects the dielectric layer 28 to the dielectric layer 38. In some embodiments, a thickness h1 of the waveguide 20, a thickness h2 of the waveguide element 522, a thickness h3 of the waveguide element 523, a thickness h4 of the waveguide element 524, and a thickness h5 of the waveguide 30 may be the same or different. The number of the waveguide elements may vary according to actual applications and is not limited thereto.

In some embodiments, the optically-transmissive element 521 is between and optically coupled to the optical connection element 3 and the photonic component 2. In some embodiments, the optically-transmissive element 521 covers the waveguide elements 522, 523, and 524. In some embodiments, a refractive index of the optically-transmissive element 521 is less than about 2.7, about 2.4, about 2, or about 1.5. In some embodiments, a refractive index of the optically-transmissive element 521 is from about 1.31 to about 1.55. In some embodiments, the refractive index of the optically-transmissive element 521 is less than refractive indexes of the waveguide elements 522, 523, and 524. In some embodiments, the optically-transmissive element 521 includes an inorganic dielectric layer (e.g., silicon oxide), a polymer layer, or a combination thereof.

In some embodiments, the waveguide elements 522, 523, and 524 are between the optical connection element 3 and the photonic component 2 and configured to gradually direct a light to the waveguide 20 of the photonic component 2. In some embodiments, the waveguide elements 522, 523, and 524 are configured to gradually direct a light to the waveguide 30 of the optical connection element 3. In some embodiments, a light is coupled from the waveguide 20 through the waveguide elements 522, 523, and 524 one by one to the waveguide 30, or from the waveguide 30 through the waveguide elements 522, 523, and 524 one by one to the waveguide 20. In some embodiments, each of the waveguide elements 522, 523, and 524 is arranged one by one to transmit a light from the waveguide 20 through the waveguide elements 522, 523, and 524 to the waveguide 30, or from the waveguide 30 through the waveguide elements 522, 523, and 524 to the waveguide 20. In some embodiments, a light propagation path between two adjacent waveguide elements defines a light propagation direction substantially perpendicular to an extending direction of the waveguide elements 522, 523, and 524. For example, a light propagation path between the waveguide elements 522 and 523 is substantially perpendicular to an extending direction of the waveguide elements 522 and 523.

Each of the waveguides 20 and 30 and an adjacent waveguide element (e.g., the waveguide element 522 or 524) may partially overlap vertically or from a top view perspective. In some embodiments, the waveguide 20 and the waveguide element 522 partially overlap by an overlapping length L12 (also referred to as "a coupling length" or "a coupling coverage") vertically or from a top view perspective. In some embodiments, the waveguide 30 and the waveguide element 524 partially overlap by an overlapping length L45 vertically or from a top view perspective. Every two adjacent waveguides elements may partially overlap vertically or from a top view perspective. In some embodiments, the waveguide elements 522 and 523 partially overlap by an overlapping length L23 vertically or from a top view perspective with an overlapping length L12, and the waveguide elements 523 and 524 partially overlap by an overlapping length L34 vertically or from a top view perspective. The coupling lengths may be adjusted to adjust the phase (e.g., $\pi$, $\pi/2$, or $\pi/4$) of the transmitted light.

Every adjacent waveguide (or waveguide elements) may be spaced apart from each other by a coupling distance (also referred to as "a coupling pitch"). In some embodiments, the waveguide 20 and the waveguide element 522 are spaced apart from each other by a coupling distance s12. In some embodiments, the waveguide element 522 and the waveguide element 523 are spaced apart from each other by a coupling distance s23. In some embodiments, the waveguide element 523 and the waveguide element 524 are spaced apart from each other by a coupling distance s34. In some embodiments, the waveguide 30 and the waveguide element 524 are spaced apart from each other by a coupling distance s45. The coupling distances s12, s23, s34, and s34 may be the same or different.

In some embodiments, the waveguide elements 522, 523, and 524 may be or include optically-transmissive elements that are between and optically coupled to the optical connection element 3 and the photonic component 2. In some embodiments, a refractive index of each of the waveguide elements 522, 523, and 524 is equal to or greater than about 2.0, about 2.2, about 3, or about 3.5. The waveguide elements 522, 523, and 524 may be or include silicon, silicon nitride ($Si_3N_4$), lithium niobate ($LiNbO_3$), or a combination thereof. In some embodiments, the waveguide elements 522, 523, and 524 and the dielectric layer 521 may be formed by film deposition and lithography patterning processes. Such processes are compatible with the processes for forming the waveguides 20 and 30 and the dielectric layers 28 and 38, and thus the manufacturing process of the optoelectronic package is simplified.

The waveguide elements 522, 523, and 524 may be configured as a multi-channel directional coupler that optically couples the photonic component 2 to the optical connection element 3. The partially overlapped waveguide elements 522, 523, and 524 may be configured to vertically couple a light between the photonic component 2 and the optical connection element 3. As the coupling lengths and/or the coupling pitches being relatively small can increase the optical coupling efficiency, the difficulty and complexity of the manufacturing process can be increased significantly. According to some embodiments of the present disclosure, by adjusting the coupling lengths and/or the coupling pitches, the difficulty and complexity of the manufacturing process can be lowered while the optical coupling between the photonic component 2 and the optical connection element 3 can be achieved to a satisfactory extent.

Figure 2C:
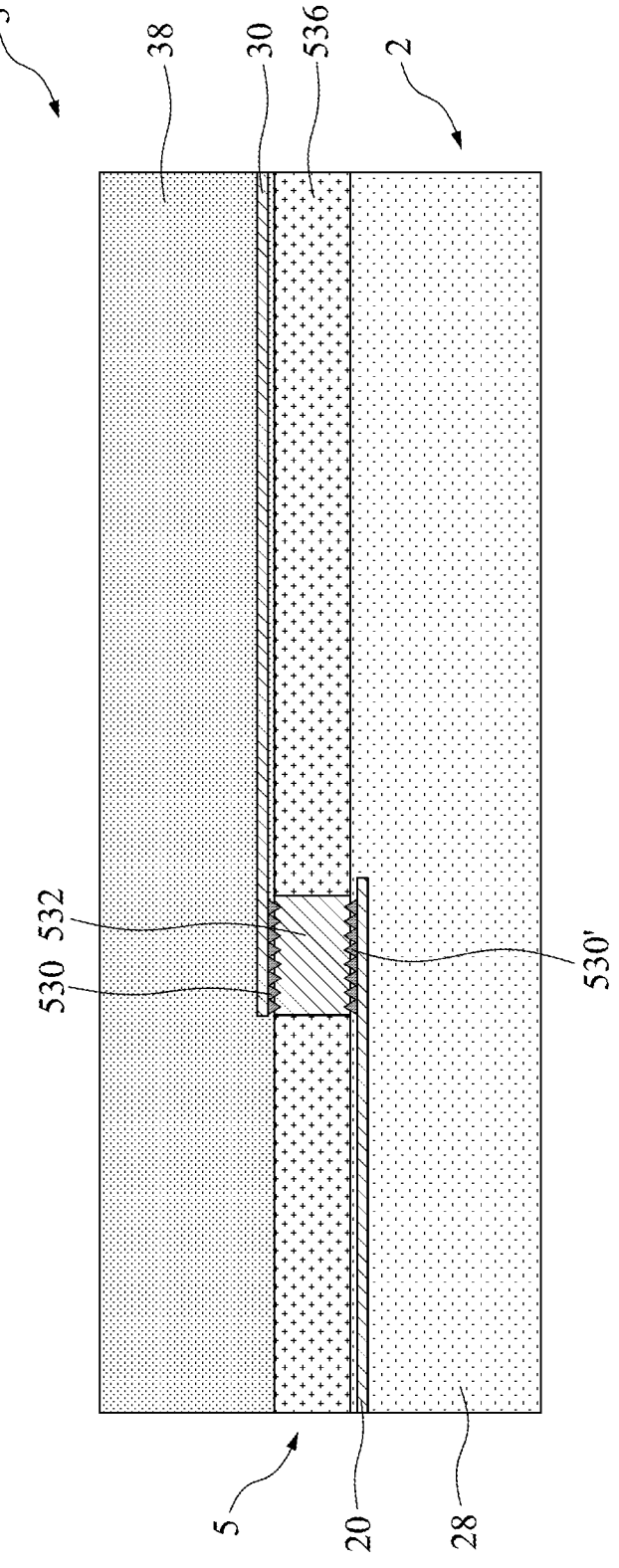
FIG. 2C illustrates a cross-sectional view of a portion of an optoelectronic package according to some embodiments of the present disclosure.

FIG. 2C illustrates a cross-sectional view of a portion of an optoelectronic package according to some embodiments of the present disclosure. For example, FIG. 2C may illustrate a portion of the optoelectronic package 1 including the optical coupling structure 5 that optically couples the optical connection element 3 to the photonic component 2. In some embodiments, FIG. 2C may illustrate a cross-sectional view of a portion of the optoelectronic package 1 including the optical coupling structure 5' that optically couples the optical connection element 3 to the photonic component 2'.

In some embodiments, the optical coupling structure 5 includes optical coupling elements 530 and 530', an optical interposer 532, and an optically-transmissive element 536.

In some embodiments, the optical coupling element 530 is on or over the waveguide 30. In some embodiments, the optical coupling element 530 at least partially overlaps the waveguide 30 vertically or from a top view perspective. In some embodiments, the optical coupling element 530' is on or over the waveguide 20. In some embodiments, the optical coupling element 530' at least partially overlaps the waveguide 20 vertically or from a top view perspective. In some embodiments, the optical coupling element 530 and the optical coupling element 530' at least partially overlap vertically or from a top view perspective. In some embodiments, the optical coupling elements 530 and 530' (which may be collectively referred to as "an optical structure") are between the optical connection element 3 and the photonic component 2 and configured to gradually direct a light to the waveguide 20 of the photonic component 2. In some embodiments, the optical coupling elements 530 and 530' are configured to gradually direct a light to the waveguide 30 of the optical connection element 3.

In some embodiments, the optical coupling elements 530 and 530' each includes an optical microstructure. In some embodiments, the optical coupling elements 530 and 530' each includes a grating coupler. In some embodiments, a refractive index of the optical coupling element 530 and a refractive index of the optical coupling element 530' are equal to or less than less than about 2.7, about 2.4, about 2, or about 1.5.

In some embodiments, the optical interposer 532 is between the optical coupling element 530 and the optical coupling element 530'. In some embodiments, the optical coupling element 530 and the optical coupling element 530' partially extend into the optical interposer 532. In some embodiments, a light is transmitted or coupled from the waveguide 20 through the optical coupling element 530', the optical interposer 532, and the optical coupling element 530 to the waveguide 30. In some embodiments, the optical interposer 532 includes a polymer structure, such as a thermal-cured polymer or a UV-cured polymer (e.g., an epoxy polymer). In some embodiments, a refractive index of the optical interposer 532 is equal to or greater than about 2.0, about 2.2, about 3, or about 3.5. In some embodiments, the refractive index of the optical coupling element 530 and the refractive index of the optical coupling element 530' are less than a refractive index of the optical interposer 532.

In some embodiments, the optically-transmissive element 536 is between and optically coupled to the optical connection element 3 and the photonic component 2. In some embodiments, the optically-transmissive element 536 includes an inorganic dielectric layer (e.g., silicon oxide), a polymer layer, or a combination thereof.

The optical coupling element 530 and 530' may be configured to optically couple the photonic component 2 to the optical connection element 3. The overlapped optical coupling element 530 and 530' may be configured to vertically couple a light between the photonic component 2 and the optical connection element 3.

Figure 2D:
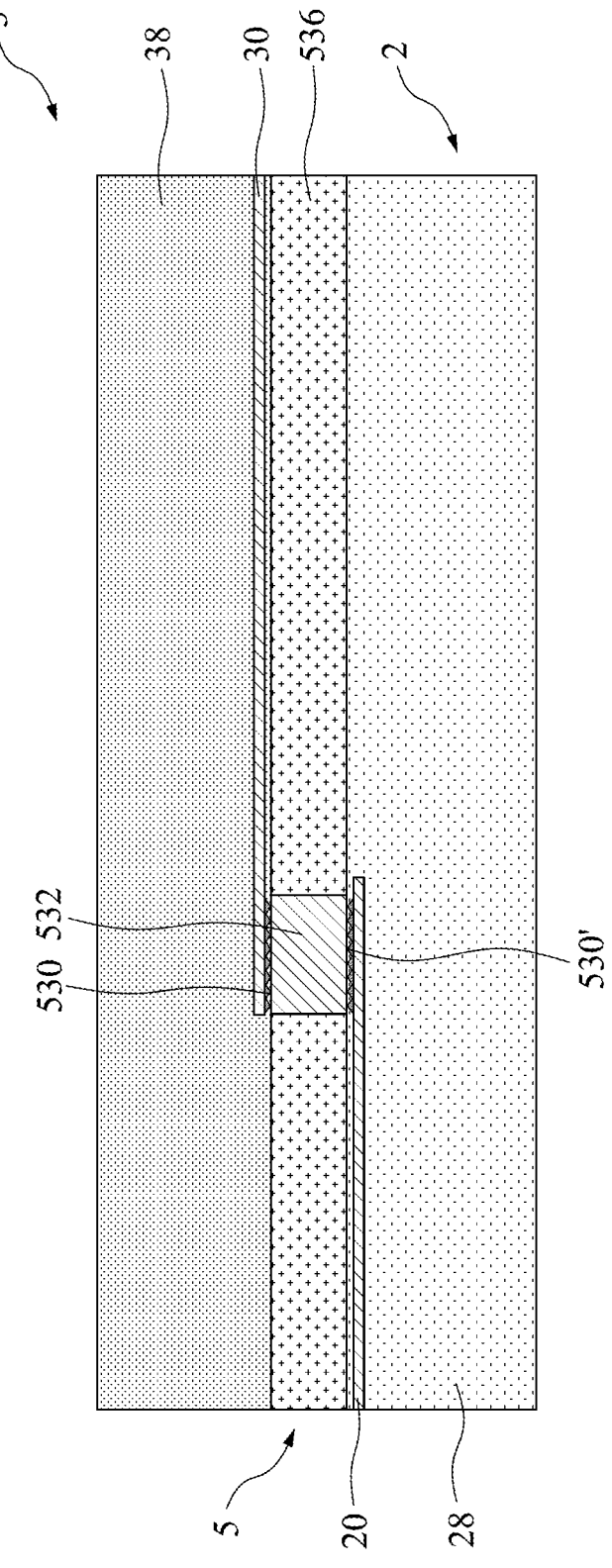
FIG. 2D illustrates a cross-sectional view of a portion of an optoelectronic package according to some embodiments of the present disclosure.

FIG. 2D illustrates a cross-sectional view of a portion of an optoelectronic package according to some embodiments of the present disclosure. For example, FIG. 2D may illustrate a portion of the optoelectronic package 1 including the optical coupling structure 5 that optically couples the optical connection element 3 to the photonic component 2. In some embodiments, FIG. 2D may illustrate a cross-sectional view of a portion of the optoelectronic package 1 including the optical coupling structure 5' that optically couples the optical connection element 3 to the photonic component 2'.

The structure illustrated in FIG. 2D is similar to that illustrated in FIG. 2C, and the difference is that the optical coupling element 530 and the optical coupling element 530' do not extend into the optical interposer 532.

Figure 2E:
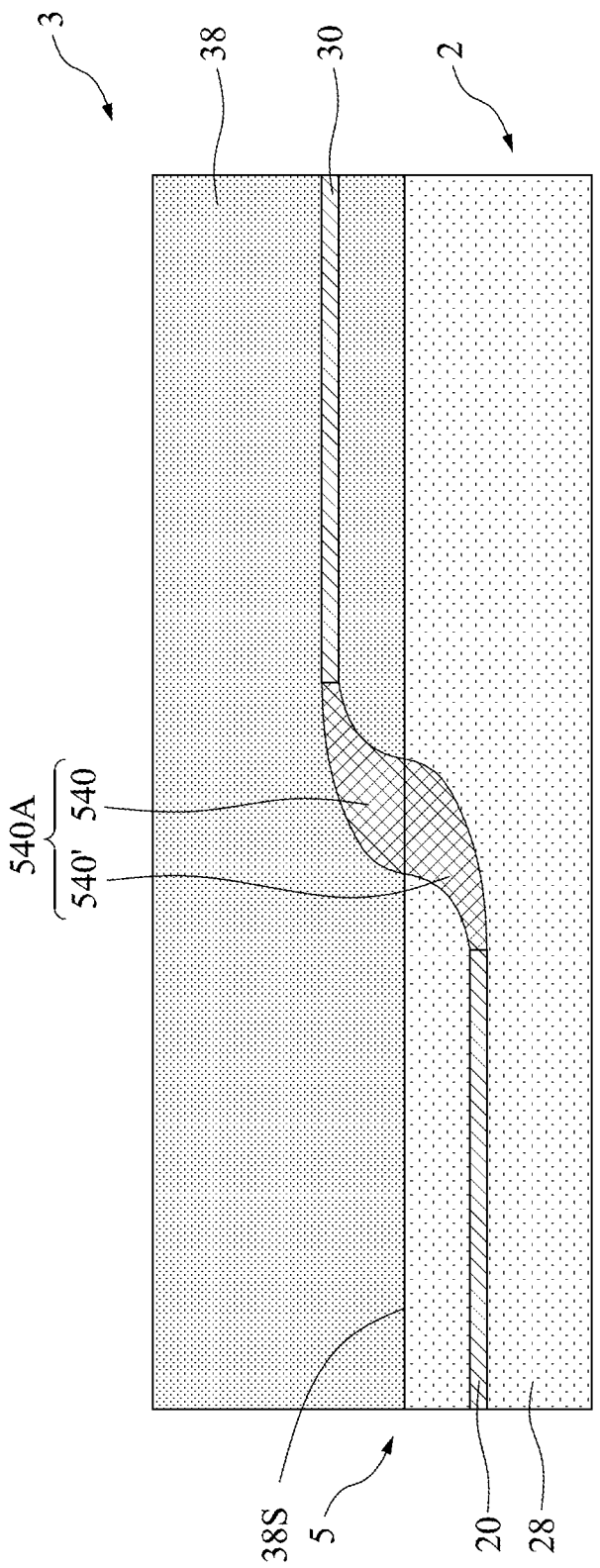
FIG. 2E illustrates a cross-sectional view of a portion of an optoelectronic package according to some embodiments of the present disclosure.

FIG. 2E illustrates a cross-sectional view of a portion of an optoelectronic package according to some embodiments of the present disclosure. For example, FIG. 2E may illustrate a portion of the optoelectronic package 1 including the optical coupling structure 5 that optically couples the optical connection element 3 to the photonic component 2. In some embodiments, FIG. 2E may illustrate a cross-sectional view of a portion of the optoelectronic package 1 including the optical coupling structure 5' that optically couples the optical connection element 3 to the photonic component 2'.

In some embodiments, the optical coupling structure 5 includes a gradient index structure 540A between and optically coupled to the optical connection element 3 and the photonic component 2. In some embodiments, the gradient index structure 540A contacts the waveguide 20 and the waveguide 30. In some embodiments, the gradient index structure 540A is configured to gradually direct a light to the waveguide 20 of the photonic component 2. In some embodiments, the gradient index structure 540A is configured to gradually direct a light to the waveguide 30 of the optical connection element 3.

In some embodiments, the gradient index structure 540A has a refractive index increasing toward an interface 38S between the dielectric layers 28 and 38 and then decreasing away from the interface 38S. In some embodiments, the gradient index structure 540A has a refractive index decreasing toward the interface 38S between the dielectric layers 28 and 38 and then increasing away from the interface 38S. In some embodiments, the gradient index structure 540A includes gradient index layers 540 and 540'. In some embodiments, the gradient index layer 540 has a refractive index increasing toward the interface 38S or a refractive index decreasing toward the interface 38S. In some embodiments, the gradient index layer 540' has a refractive index increasing toward the interface 38S or a refractive index decreasing toward the interface 38S. In some embodiments, an equivalent refractive index of the gradient index structure 540A is substantially the same as the refractive index of the waveguide 20 and/or the refractive index of the waveguide 30.

In some embodiments, the gradient index structure 540A includes one or more dielectric layers doped with metal ions, dielectric nanoparticles, or a combination thereof. The metal ions may be or include gold ions, silver ions, copper ions, or other suitable metal ions. The dielectric nanoparticles may be or include silicon oxide. In some embodiments, the gradient index layers 540 and 540' may be separate dielectric layers each doped with metal ions, dielectric nanoparticles, or a combination thereof. In some embodiments, the gradient index structure 540A may be formed from a portion of the dielectric layer 28 and a portion of the dielectric layer 38. In some embodiments, the gradient index layers 540 and 540' are formed within the optical connection element 3 and the photonic component 2, respectively, and then the gradient index structure 540A is formed by bonding the gradient index layers 540 and 540' through bonding the optical connection element 3 to the photonic component 2.

The gradient index structure 540A may be configured to optically couple the photonic component 2 to the optical connection element 3. The gradient index structure 540A may be configured to vertically couple a light between the photonic component 2 and the optical connection element 3.

In some embodiments, each of the optical coupling structure 5 illustrated in FIGS. 2A-2E may be configured as a waveguide interposer. In some embodiments, each of the optical coupling structure 5 illustrated in FIGS. 2A-2E may be configured as a waveguide bridging element between photonic components or between a photonic component and an optical connection element. In some embodiments, the optical coupling structure 5 illustrated in FIGS. 2A-2E may made within the photonic component and/or the photonic component or be viewed as a part of the photonic component and/or the photonic component. In some embodiments, each of the optical coupling structures 5 and 5' of the optoelectronic package 1 may adopt any one of the structures illustrated in FIGS. 2A-2E. In some embodiments, the optical coupling structure 5 and the optical coupling structure 5' may have different structures depending on the specific applications of the photonic components 20 and 20'.

Figure 3:
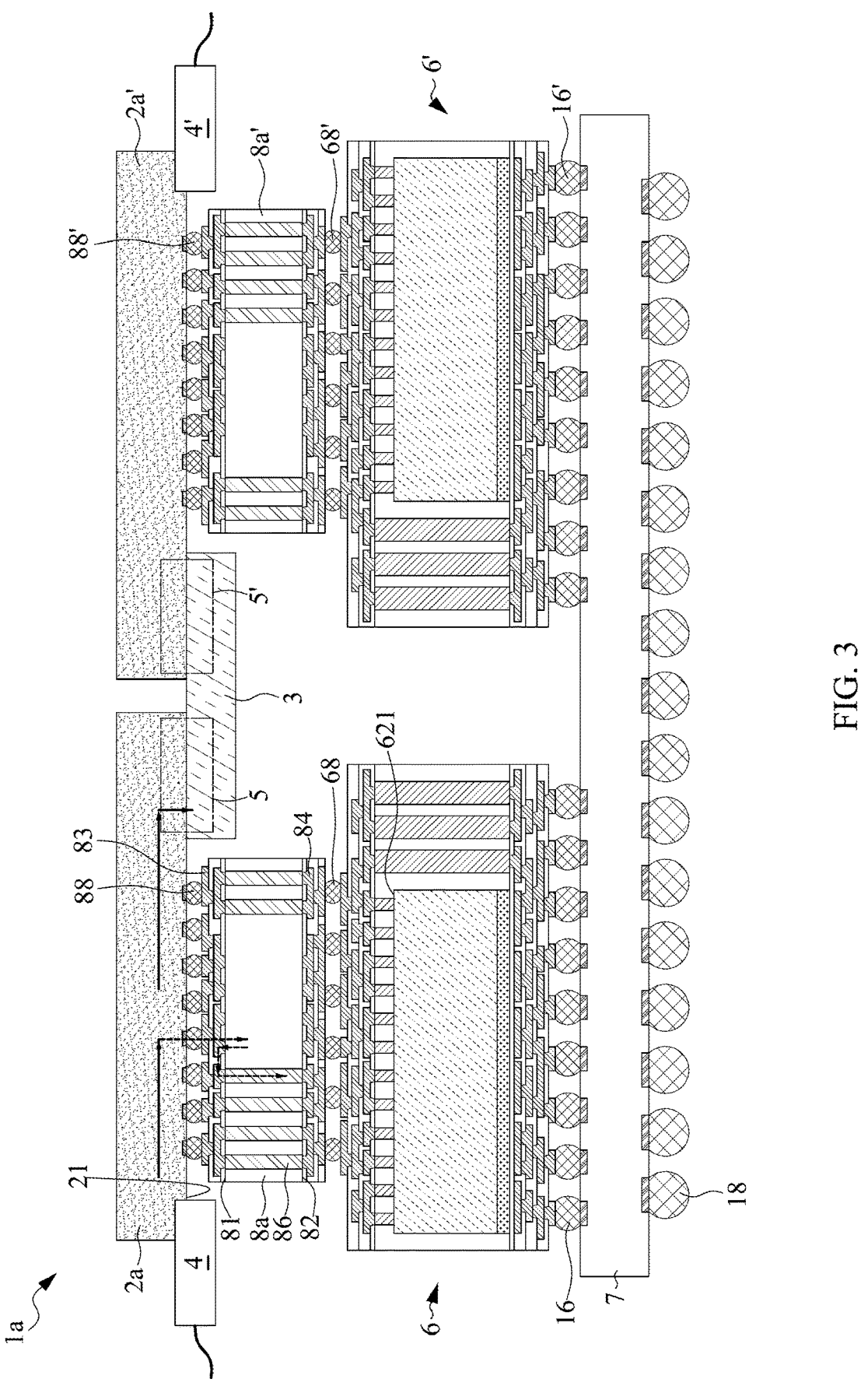
FIG. 3 illustrates a cross-sectional view of an example of an optoelectronic package according to some embodiments of the present disclosure.

FIG. 3 illustrates a cross-sectional view of an example of an optoelectronic package 1a according to some embodiments of the present disclosure. The optoelectronic package 1a is similar to the optoelectronic package 1 shown in FIGS. 1A and 1B, and the difference therebetween is describe as follows.

As shown in FIG. 3, the optoelectronic package 1a may also include a carrier 7, processing units 6 and 6', photonic components 2a and 2a', an optical connection element 3, optical coupling structure 5 and 5', optical components 4 and 4', electronic components 8a and 8a', electrical connection elements 88, 88', 68 and 68', and electrical contacts 16, 16' and 18.

In the optoelectronic package 1a, the carrier 7, the processing units 6 and 6', the electrical contacts 16, 16' and 18 and the arrangements thereof are similar to or substantially the same as those in the optoelectronic package 1. As show in FIG. 3, the photonic components 2a and 2a', the optical connection element 3, the optical components 4 and 4', and the electronic components 8a and 8a' of the optoelectronic package 1a are arranged in an upside down position relative to those of the optoelectronic package 1 shown in FIGS. 1A and 1B. Specifically, the electronic component 8a is disposed adjacent to the processing unit 6, and the photonic component 2a is disposed on or over the electronic component 8a. The electronic component 8a is located between the processing unit 6 and the photonic component 2a. The electrical component 8a is more adjacent (or closer) to the processing unit 6 than the photonic component 2 is.

The electronic component 8a includes a conductive via 86 (may be referred to as "tall pillar") penetrating through the electronic component 8a. In some embodiments, the electronic component 8a has a surface 81 and a surface 82 opposite to the surface 81. The surface 81 of the electronic component 8a may be an active surface. The surface 82 faces the processing unit 6. The surface 81 (the active surface) faces away from the processing unit 6. In some embodiments, the electronic component 8a may include circuit structures 83 and 84 disposed on the surfaces 81 and 82, respectively. The conductive via 86 electrically connects the circuit structures 83 and 84. The conductive via 86 may be configured to transmit electric signals between the surface 81 and the surface 82. In some embodiments, the electronic component 8a may be electrically connected to the processing unit 6 through the conductive via 86. Specifically, the electric signals transmitted between electronic component 8a and the processing unit 6 may pass through the circuit structure 83, the conductive via 86, the circuit structure 84 and the electrical connection element(s) 68. The electronic component 8a' has the same components and arrangements as the electronic component 8a. The electrical connection element(s) 68 may electrically connect the electronic component 8a to the processing unit 6. The electrical connection element(s) 68' may electrically connect the electronic component 8a' to the processing unit 6'.

The photonic component 2a is electrically connected to the electronic component 8a. The photonic component 2a has a surface 21 facing the active surface 621 of the processing unit 6. The surface 21 of the photonic component 21 may be an active surface and electrically connected to the active surface 81 of the electronic component 8a. In some embodiments, the photonic component 2a may not include a conductive via or a tall pillar. The photonic component 2a' may be similar to the photonic component 2a'. The electrical connection element(s) 88 may electrically connect the photonic component 2a to the electronic component 8a. The electrical connection element(s) 88' may electrically connect the photonic component 2a' to the electronic component 8a'. The optical connection element 3 is disposed on or over the photonic component 2a and/or the photonic component 2a'. The coupling structure 5 is formed or disposed between the photonic component 2a and the optical connection element 3. The coupling structure 5' is formed or disposed between the photonic component 2a' and the optical connection element 3. The optical component 4 is disposed on and connected to the photonic component 2a. The optical component 4' is disposed on and connected to the photonic component 2a'. In some embodiments, optical signals may be transmitted from the optical component 4 to the photonic component 2a. In some embodiments, the optical signals may be further transmitted through the photonic component 2a to the optical connection element 3. In some embodiments, the optical signals may be converted by the photonic component 2a to electric signals, and the electric signals may be transmitted to the electronic component 8a and further to the processing unit 6 by passing through the circuit structure 83, the conductive via 86, the circuit structure 84 and the electrical connection element(s) 68. In some embodiments, the processing unit 6 transmits electric signals to the photonic component 2a through the electrical component 8a, such as through the conductive via 86 of the electrical component 8a. As shown in FIG. 3, the arrows with solid line indicate the transmitting path of the optical signals, and the arrows with dashed line indicate the transmitting path of the electric signals.

In some embodiments where the first optical engine includes the photonic component 2a and the electronic component 8a and the second optical engine includes the photonic component 2a' and the electronic component 8a', the processing unit 6 is disposed under the first optical engine, and is electrically connected to the first optical engine (e.g., the electronic component 8 of the first optical engine) through a tall pillar within the first optical engine (e.g., the conductive via 86 penetrating through the electronic component 8a). Similarly, the processing unit 6' is disposed under the second optical engine, and is electrically connected to the second optical engine through a tall pillar within the second optical engine (e.g., the conductive via penetrating through the electronic component 8a)'.

In the optoelectronic package 1a shown in FIG. 3, the tall pillar (e.g., the conductive via 86) is located within the electronic component 8a instead of located within the photonic component (such as the conductive via 26 of the photonic component 2 as shown in FIG. 1). Since the tall pillar is not required to be formed in the photonic component 2a, the production process of the photonic component 2a may be relatively simple as compared to that of a photonic component having a tall pillar (e.g., the photonic component 2 as shown in FIG. 1). In addition, in the optoelectronic package 1a, the electronic component 8a is disposed adjacent to the processing unit 6. Electric signals can be transmitted along a vertical direction through a conductive path with a short distance to the processing unit 6 and the carrier 7. For example, signals received from the optical component 4 may be transmitted to the carrier 7 directly through the photonic component 2a and the electronic component 8a, without passing through any one of the components twice or more.

Figure 4:
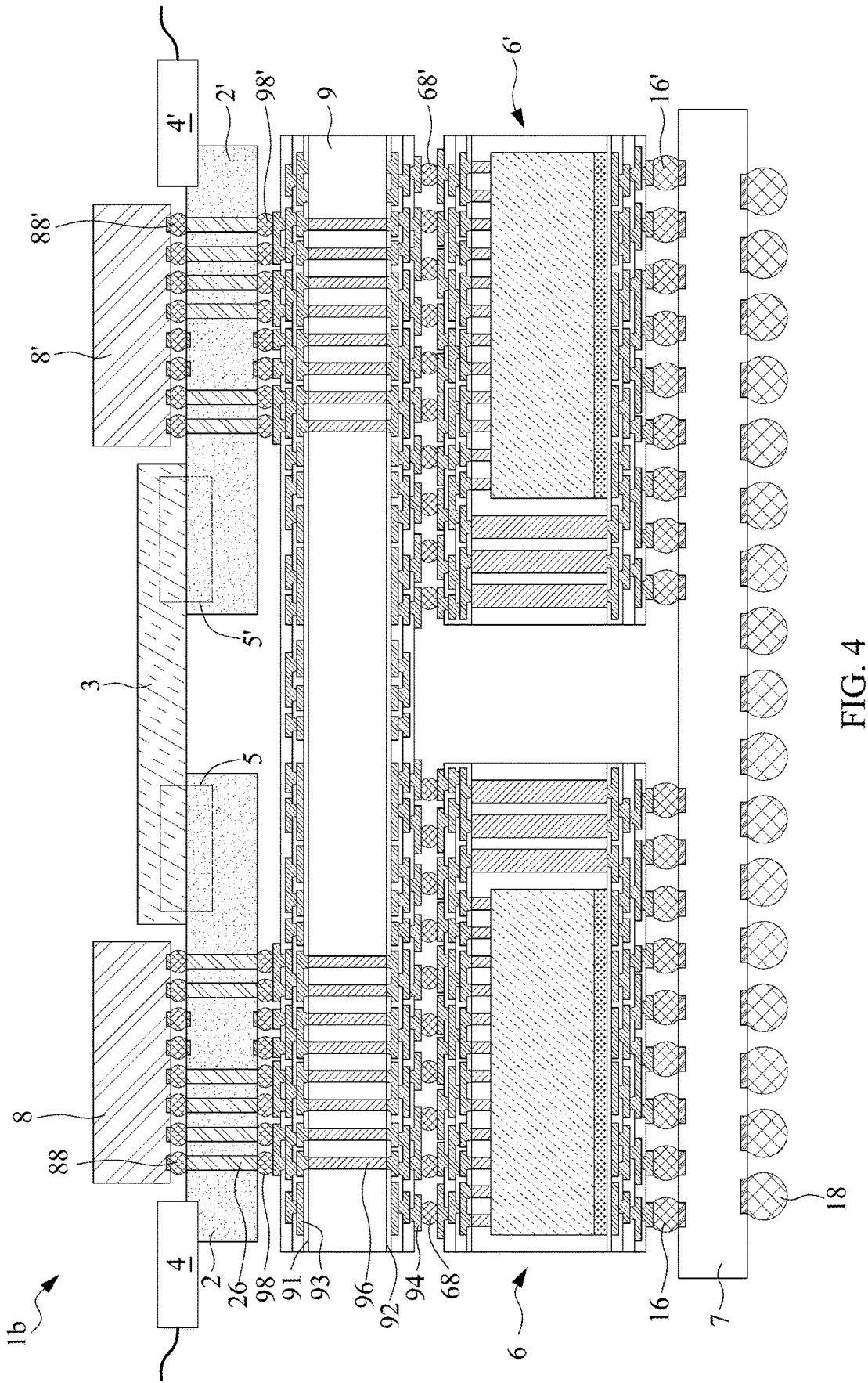
FIG. 4 illustrates a cross-sectional view of an example of an optoelectronic package according to some embodiments of the present disclosure.

FIG. 4 illustrates a cross-sectional view of an example of an optoelectronic package 1b according to some embodiments of the present disclosure. The optoelectronic package 1b is similar to the optoelectronic package 1 shown in FIGS. 1A and 1B, but further includes a bridging component 9 and electrical connection elements 98 and 98'.

As shown in FIG. 4, the optoelectronic package 1b may also include a carrier 7, processing units 6 and 6', photonic components 2 and 2', an optical connection element 3, optical coupling structure 5 and 5', optical components 4 and 4', electronic components 8 and 8', electrical connection elements 88, 88', 68 and 68', and electrical contacts 16, 16' and 18. In the optoelectronic package 1b, the carrier 7, the processing units 6 and 6', the electrical contacts 16, 16' and 18, the photonic components 2 and 2', the electrical connection elements 88 and 88' and the arrangements thereof are similar to or substantially the same as those in the optoelectronic package 1.

As shown in FIG. 4, the optoelectronic package 1b further comprises a bridging component 9. The bridging component 9 is disposed at least partially over or on both of the processing units 6 and 6'. The bridging component 9 is configured to electrically connect the processing units 6 and 6'. In some embodiments, the bridging component 9 has a surface 91 and a surface 92 opposite to the surface 91. The bridging component 9 may include circuit structures 93 and 94 respectively disposed on the surface 91 and 92. In some embodiments, the bridging component 9 may include one or more conductive vias 96 penetrating through the bridging component 9. The conductive via 96 may be configured to transmit electric signals between the surface 91 and the surface 92. In some embodiments, the conductive via 96 electrically connects the circuit structures 93 and 94.

In some embodiments, the bridging component 9 is electrically connected to the processing unit 6 and/or the processing unit 6'. For example, the circuit structure 94 is electrically connected to the processing unit 6 through the electric connection elements 68, and is electrically connected to the processing unit 6' through the electric connection elements 68'.

The photonic component 2 is disposed on or over the bridging component 9. The conductive via 26 of the photonic component 2 is electrically connected to the processing unit 6 through the bridging component 9, such as through the conductive via 96 of the bridging component 9. The electric connection elements 98 electrically connects the photonic component 2 to the bridging component 9. The electric connection elements 98' electrically connects the photonic component 2' to the bridging component 9. The electronic component 8 is disposed on or over the photonic component 2. The electronic component 8 is electrically connected to the processing unit 6 through the conductive via 26 of the photonic component 2 and the conductive via 96 of the bridging component 9.

As describe above, the photonic component 2 and the electronic component 8 are jointly called "optical engine", or are integrated as an optical engine (e.g., a first optical engine). The photonic component 2' and the electronic component 8' are jointly called "optical engine", or are integrated as an optical engine (e.g., a second optical engine). The first optical engine is disposed on or over the processing unit 6. The second optical engine is disposed on or over the processing unit 6'. In some embodiments, the processing unit 6 and the first optical engine are disposed on and electrically connected to two opposite sides of the bridging component 9, respectively. In some embodiments, the processing unit 6' and the second optical engine are disposed on and electrically connected to two opposite sides of the bridging component 9, respectively. The first optical engine is spaced apart from the processing unit 6 by the bridging component 9. The second optical engine is spaced apart from the processing unit 6' by the bridging component 9. In some embodiments, the bridging component 9 is further configured to electrically connect the processing unit 6 and the first optical engine. In some embodiments, the bridging component 9 is further configured to electrically connect the processing unit 6' and the second optical engine. In some embodiments, the bridging component 9 is configured to electrically connect the first optical engine and the second optical engine.

In the optoelectronic package 1b, the bridging component 9 electrically connects the processing units 6 and 6'. The processing units 6 and 6' can communicate efficiently with each other through the bridging component 9 instead of through the carrier 7.

Figure 5:
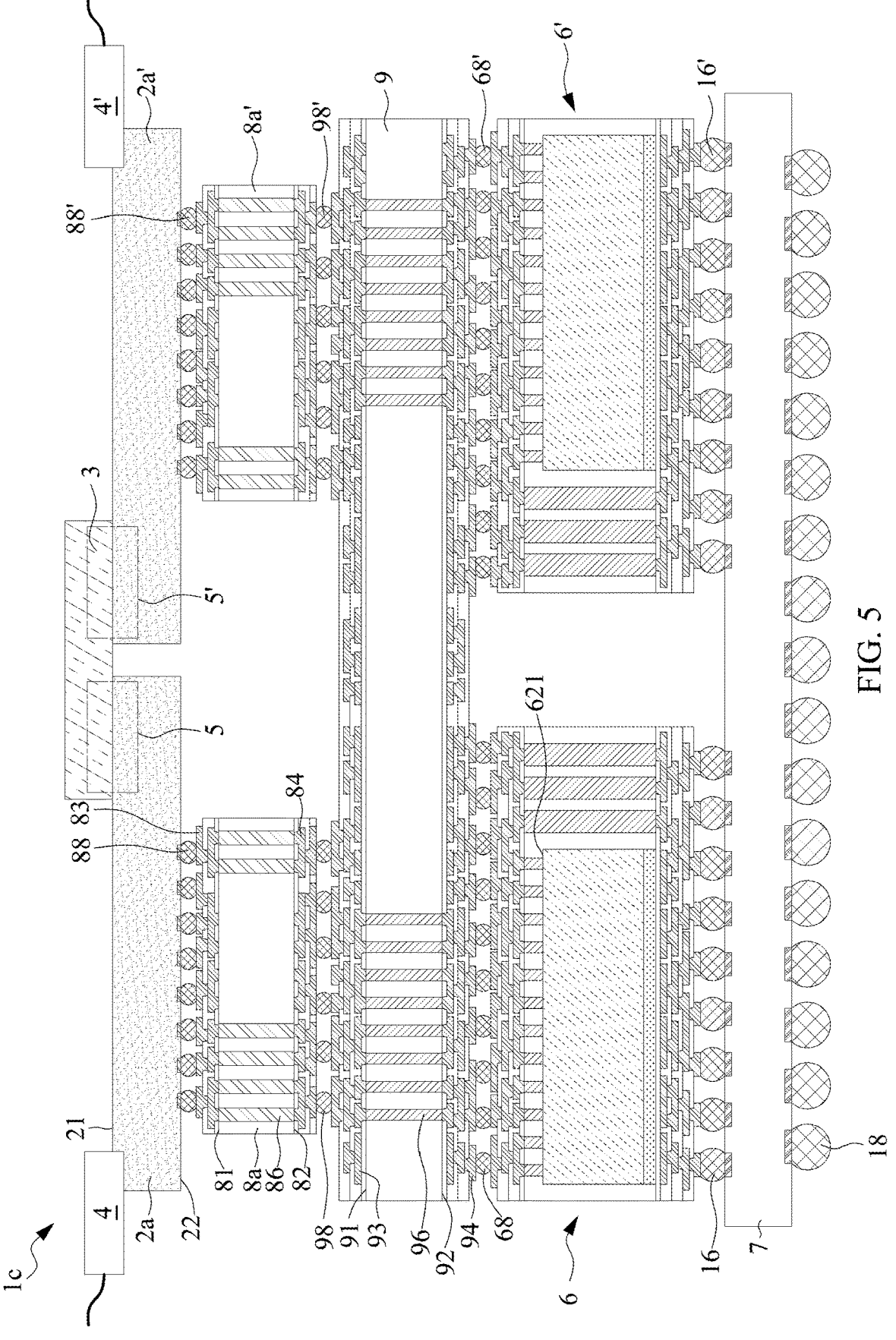
FIG. 5 illustrates a cross-sectional view of an example of an optoelectronic package according to some embodiments of the present disclosure.

FIG. 5 illustrates a cross-sectional view of an example of an optoelectronic package 1c according to some embodiments of the present disclosure. The optoelectronic package 1c is similar to the optoelectronic package 1a shown in FIG. 3, but further includes a bridging component 9 and electrical connection elements 98 and 98'.

As shown in FIG. 5, the optoelectronic package 1c may also include a carrier 7, processing units 6 and 6', electronic components 8a and 8a', photonic components 2a and 2a', an optical connection element 3, optical coupling structure 5 and 5', optical components 4 and 4', electrical connection elements 88, 88', 68 and 68', and electrical contacts 16, 16' and 18. In the optoelectronic package 1c, the carrier 7, the processing units 6 and 6', the electrical contacts 16, 16' and 18, the electronic components 8a and 8a', the electrical connection elements 88 and 88', and the arrangements thereof are similar to or substantially the same as those in the optoelectronic package 1a.

As shown in FIG. 5, the optoelectronic package 1c further comprises a bridging component 9. The bridging component 9 is disposed at least partially over or on both of the processing units 6 and 6'. In some embodiments, the bridging component 9 is configured to electrically connect the processing units 6 and 6'. In some embodiments, the bridging component 9 has a surface 91 and a surface 92 opposite to the surface 91. The bridging component 9 may include circuit structures 93 and 94 (e.g., RDL structures) respectively disposed on the surface 91 and 92. In some embodiments, the bridging component 9 may include one or more conductive vias 96 penetrating through the bridging component 9. The conductive via 96 may be configured to transmit electric signals between the surface 91 and the surface 92. In some embodiments, the conductive via 96 electrically connects the circuit structures 93 and 94.

In some embodiments, the bridging component 9 is electrically connected to the processing unit 6 and/or the processing unit 6'. For example, the circuit structure 94 is electrically connected to the processing unit 6 through the electric connection elements 68, and is electrically connected to the processing unit 6' through the electric connection elements 68'.

The electronic component 8a is disposed on or over the bridging component 9. The electric connection elements 98 electrically connects the electronic component 8a to the bridging component 9. The conductive via 86 of the electronic component 8a is electrically connected to the processing unit 6 through the bridging component 9, such as through the conductive via 96 of the bridging component 9. The active surface 81 of the electronic component 8a may be electrically connected to the processing unit 6 through the conductive via 86 of the electronic component 8a and the conductive via 96 of the bridging component 9. The electronic component 8a' is also disposed on or over the bridging component 9. The electric connection elements 98' electrically connects the electronic component 8a' to the bridging component 9.

The photonic component 2a is disposed at least partially over the electronic component 8a. The electronic component 8a is more adjacent (or closer) to the bridging component 9 than the photonic component 2a is. As shown in FIG. 5, the surface 21 (the active surface) of the photonic component 2a faces away from the electronic component 2a. The optical connection element 3 is at least partially disposed on the surface 21 of the photonic component 2a, and is optically coupled to the photonic component 2a through the optical coupling structure 5. The optical component 4 is disposed at least partially over the surface 21 of the photonic component 2a. In some embodiments, the photonic component 2a may include conductive via (not shown) to transmit electric signals from the surface 21 to a surface 22 opposite to the surface 21. The photonic component 2a' and the optical component 4' may be disposed on the electronic component 8a' in a manner similar to the photonic component 2a and the optical component 4 on the electronic component 8a. The optical connection element 3 may also be optically coupled to the photonic component 2a' through the optical coupling structure 5'.

In the optoelectronic package 1c shown in FIG. 5, since the electronic component 8a is more adjacent (or closer) to the bridging component 9 than the photonic component 2a is, electric signals can be transmitted along a vertical direction through a conductive path with a short distance to the bridging component 9, and to the processing unit 6 and the carrier 7. For example, signals received from the optical component 4 may be transmitted to the carrier 7 directly through the photonic component 2a and the electronic component 8a, without passing through any one of the components twice or more.

FIG. 6 illustrates a cross-sectional view of an example of an optoelectronic package 1d according to some embodiments of the present disclosure. The optoelectronic package 1d is similar to the optoelectronic package 1a shown in FIG. 3, and but the processing unit 6' and the processing unit 6 in the optoelectronic package 1d are formed or integrated in a single processing unit 6d in optoelectronic package 1d.

The processing unit 6d includes the processing die 62 and the processing die 62'. The dielectric structure 64 surrounds or encapsulates both the processing dice 62 and 62'. The circuit structures 61 and 67 are disposed on two opposite sides of the dielectric structure 64, and electrically connect the processing dice 62 and 62'. The processing dice 62 and 62' can communicate efficiently with each other through the circuit structure 61 and/or the circuit structure 67 without the need of a bridging component (such as the bridging component 9 as shown in FIG. 5). In some embodiments, the processing unit 6d may include two or more processing dice. In some embodiments, one of the processing dice may further include control function or may be a control IC for controlling these processing dice.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to $\pm10\%$ of that numerical value, such as less than or equal to $\pm5\%$, less than or equal to $\pm4\%$, less than or equal to $\pm3\%$, less than or equal to $\pm2\%$, less than or equal to $\pm1\%$, less than or equal to $\pm0.5\%$, less than or equal to $\pm0.1\%$, or less than or equal to $\pm0.05\%$. For example, two numerical values can be deemed to be "substantially" the same or equal if a difference between the values is less than or equal to $\pm10\%$ of an average of the values, such as less than or equal to $\pm5\%$, less than or equal to $\pm4\%$, less than or equal to $\pm3\%$, less than or equal to $\pm2\%$, less than or equal to #1%, less than or equal to $\pm0.5\%$, less than or equal to $\pm0.1\%$, or less than or equal to $\pm0.05\%$.

Two surfaces can be deemed to be coplanar or substantially coplanar if displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. Such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optoelectronic package, comprising:

a first photonic IC;

a second photonic IC spaced apart from the first photonic IC;

an optical connection element disposed at least partially over the first photonic IC and at least partially over the second photonic IC, wherein the optical connection element is configured to provide optical signal transmission between the first photonic IC and the second photonic IC;

a first optical component disposed at least partially over the first photonic IC and spaced apart from the optical connection element, wherein the optical component is configured to provide external optical signal communication for the first photonic IC; and a first electronic component disposed over the first photonic IC and between the optical connection element and the first optical component;

wherein the first electronic component comprises an integrated digital signal processor (DSP), a transimpedance amplifier (TIA), a driver (DRV), or a combination thereof.

2. The optoelectronic package of claim 1, further comprising:

a first processing unit comprising a process die;

wherein the first electronic component is electrically connected to the first processing unit and a projection of the first processing unit in a vertical direction overlaps the first photonic IC and the first electronic component.

3. The optoelectronic package of claim 2, wherein the first photonic IC comprises a conductive via penetrating through the first photonic IC, and wherein the first electronic component is electrically connected to the processing unit through the conductive via of the first photonic IC.

4. The optoelectronic package of claim 2, wherein the first electronic component is disposed more adjacent to the first processing unit than the first photonic IC is, the first electronic component comprises a conductive via penetrating through the first electronic component, and wherein the first photonic IC is electrically connected to the first processing unit through the conductive via of the first electronic component.

5. The optoelectronic package of claim 2, wherein the process die is surrounded by a dielectric structure, and a conductive via penetrates through the dielectric structure.

6. The optoelectronic package of claim 2, further comprising a carrier supporting the first photonic IC, the first processing unit and the first electronic component, wherein the first electronic component is electrically connected to the carrier through a conductive via of the first processing unit.

7. The optoelectronic package of claim 1, wherein the first photonic IC is configured to convert optical signals received from the optical connection element to electric signals for transmission to the first electronic component, or convert electric signals received from the first electronic component to optical signals for transmission to the optical connection element.

8. The optoelectronic package of claim 1, wherein the optical connection element is or include a compact integrated waveguide ensemble (CIWE).

9. The optoelectronic package of claim 1, further comprising:

a second electronic component disposed over the second photonic IC wherein the second electronic component comprises an integrated digital signal processor (DSP), a transimpedance amplifier (TIA), a driver (DRV), or a combination thereof, wherein the optical connection element comprises a circuit structure, and the first electronic component and the second electronic component are electrically communicated with each other through the first photonic IC, the optical connection element and the second photonic IC.

10. The optoelectronic package of claim 9, further comprising:

a first processing unit disposed under the first photonic IC and comprising a first die;

a second processing unit disposed under the second photonic IC and comprising a second die; and a bridging component disposed over the first processing unit and the second processing unit, wherein the bridging component is configured to electrically connect the first processing unit and the second processing unit.

11. The optoelectronic package of claim 10, wherein the first electronic component is spaced apart from the first processing unit by the bridging component, the second electronic component is spaced apart from the second processing unit by the bridging component, and the bridging component is further configured to electrically connect the first processing unit and the first electronic component, or electrically connect the second processing unit and the second electronic component, or both.

12. The optoelectronic package of claim 9, wherein the first photonic IC receives electric signals from the first electronic component, converts the electric signals to optical signals, and transmits the optical signals to the second photonic IC through the optical connection element.

13. The optoelectronic package of claim 12, wherein the first photonic IC receives the electric signals from the first electronic component, converts the electric signals to the optical signals, and transmits the optical signals through the first optical component to a device outside of the optoelectronic package.

14. The optoelectronic package of claim 9, further comprising a first processing unit comprising a first die and a second die, wherein the first die is disposed at least partially under the first photonic IC; and the second die is disposed at least partially under the second photonic IC, and wherein the first processing unit further comprises a dielectric structure surrounding both the first die and the second die, and at least one circuit structure electrically connecting the first die and the second die.

15. The optoelectronic package of claim 1, wherein the optical connection element is configured as an optical bridge element to transmit optical signals and as an electrical bridge element to transmit electric signals.

16. The optoelectronic package of claim 1, wherein the first photonic IC comprises a region R1 and a region R2, the region R1 is optically coupled with the optical connection element, the region R2 is optically coupled with the first optical component, and the region R1 is configured to provide an optical coupling type different from that of the region R2.

17. The optoelectronic package of claim 1, wherein the first photonic IC is optically communicated with the second photonic IC in a horizontal direction and electrically communicated with the first electronic component in a vertical direction.

18. The optoelectronic package of claim 1, further comprising a third photonic IC spaced apart from the first photonic IC and the second photonic IC, wherein the optical connection element optically connects the first photonic IC, the second photonic IC and the third photonic IC.

19. The optoelectronic package of claim 18, wherein the optical connection element is disposed at least partially over the second photonic IC and at least partially over the third photonic IC.

20. The optoelectronic package of claim 1, the optical connection element covers a corner of the first photonic IC and a corner of the second photonic IC.

\* \* \* \* \*